(12) United States Patent
Irie et al.

(10) Patent No.: US 11,467,046 B2
(45) Date of Patent: Oct. 11, 2022

(54) STRESS MEASUREMENT METHOD, STRESS MEASUREMENT DEVICE, AND STRESS MEASUREMENT SYSTEM

(71) Applicant: Panasonic Intellectual Property Management Co., Ltd., Osaka (JP)

(72) Inventors: Yousuke Irie, Nara (JP); Hirotsugu Inoue, Tokyo (JP); Takuya Niioka, Tokyo (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 704 days.

(21) Appl. No.: 16/527,582

(22) Filed: Jul. 31, 2019

(65) Prior Publication Data

US 2019/0353538 A1 Nov. 21, 2019

Related U.S. Application Data

(63) Continuation of application No. PCT/JP2017/036067, filed on Oct. 4, 2017.

(30) Foreign Application Priority Data

Feb. 10, 2017 (JP) .............................. JP2017-023497

(51) Int. Cl.
  *G01L 1/10* (2006.01)
  *H01J 37/22* (2006.01)
  (Continued)

(52) U.S. Cl.
  CPC ................ *G01L 1/10* (2013.01); *G01L 1/248* (2013.01); *G01N 3/068* (2013.01); *G01N 3/08* (2013.01);
  (Continued)

(58) Field of Classification Search
  CPC ........... G01L 1/10; G01L 1/248; G01N 3/068; G01N 3/08; G01N 3/32; H01J 37/222; H01J 37/261
  (Continued)

(56) References Cited

U.S. PATENT DOCUMENTS

| | | |
|---|---|---|
| 2012/0209546 A1 | 8/2012 | Vervaeke |
| 2013/0037714 A1 | 2/2013 | Boughorbel et al. |
| 2013/0228683 A1 | 9/2013 | Boughorbel et al. |
| 2014/0312226 A1 | 10/2014 | Boughorbel et al. |

FOREIGN PATENT DOCUMENTS

| | | |
|---|---|---|
| JP | 2012-185155 | 9/2012 |
| JP | 2013-37000 | 2/2013 |

(Continued)

OTHER PUBLICATIONS

International Search Report dated Jan. 9, 2018 in International (PCT) Application No. PCT/JP2017/036067.
(Continued)

*Primary Examiner* — Octavia Davis Hollington
(74) *Attorney, Agent, or Firm* — Wenderoth, Lind & Ponack, L.L.P.

(57) ABSTRACT

In a stress measurement method, an object to be measured is vibrated at a plurality of oscillation frequencies, and a temperature amplitude of the object to be measured is measured by using a temperature sensor. Parameters of a one-dimensional heat conduction equation described below are identified by performing curve-fitting, on the basis of the one-dimensional heat conduction equation, on a measurement value of the temperature amplitude with respect to frequency characteristics of a temperature change component and a phase component based on a thermoelastic effect. The frequency characteristics are obtained at the plurality of oscillation frequencies. The one-dimensional heat conduction equation indicates a theoretical solution of a tempera-
(Continued)

ture amplitude on a surface of a coating film based on heat conduction and the thermoelastic effect of each of a substrate and the coating film. Then, a stress of the object to be measured is obtained based on the identified parameters.

11 Claims, 16 Drawing Sheets

(51) Int. Cl.
*H01J 37/26* (2006.01)
*G01L 1/24* (2006.01)
*G01N 3/08* (2006.01)
*G01N 3/32* (2006.01)
*G01N 3/06* (2006.01)

(52) U.S. Cl.
CPC .............. *G01N 3/32* (2013.01); *H01J 37/222* (2013.01); *H01J 37/261* (2013.01)

(58) Field of Classification Search
USPC .................................................... 73/862.381
See application file for complete search history.

(56) References Cited

FOREIGN PATENT DOCUMENTS

| JP | 2015-1392 | | | 1/2015 | |
|---|---|---|---|---|---|
| JP | 2016-24057 | | | 2/2016 | |
| JP | 2016024057 | A | * | 2/2016 | |
| JP | 2018105709 | A | * | 7/2018 | ............... G01N 3/06 |

OTHER PUBLICATIONS

Milo H. Belgen, "Infrared Radiometric Stress Instrumentation Application Range Study", NASA Contractor Report, NASA CR-1067, 1968.

J. McKelvie, "Consideration of the Surface Temperature Response to Cyclic Thermoelastic Heat Generation", Proceedings of SPIE, vol. 731, Stress Analysis by Thermoplastic Techniques, 1987, pp. 44-53.

Alexander K. Mackenzie, "Effects of Surface Coatings on Infrared Measurements of Thermoelastic Responses", Proceedings of SPIE, vol. 1084, Sira/Stress and Vibration: Recent Developments in Measurement and Analysis, 1989, pp. 59-71.

* cited by examiner

FIG. 6 (EXAMPLE OF FIRST REFERENCE TABLE) $\omega^* = 1 \times 10^2$ TO $1 \times 10^4$

FIG. 7

(EXAMPLE OF SECOND REFERENCE TABLE) $\omega^* = 1 \times 10^{-2}$ TO $1 \times 10^0$

FIG. 9

| | | ρ [kg/m³] | $c_p$ [J/(kg·K)] | k [W/(m·K)] | α ×10⁻⁵ [K⁻¹] | E [GPa] | ν [-] | $σ_B$ [MPa] |
|---|---|---|---|---|---|---|---|---|
| Substrate | Metallic Aluminum(A5052) | 2680 | 900 | 137 | 2.38 | 69.3 | 0.330 | 195~260 |
| | Steel(S45C) | 7840 | 490 | 44 | 1.07 | 205 | 0.279 | 550~630 |
| | Stainless steel(SUS304) | 7920 | 499 | 16 | 1.36 | 197 | 0.291 | 520 |
| | Ceramic Alumina(Al₂O₃) | 3089 | 799 | 36 | 0.68~0.73 | 280~380 | 0.23 | 120~213 |
| | Silicon carbide(SiC) | 3146 | 674 | 270 | 0.37 | 430~440 | 0.16~0.17 | - |
| | Plastic ABS | 1020~1300 | 1300~1700 | 0.17~0.21 | 6.5~9.5 | 1.8~3.0 | 0.35~0.38 | 23~55 |
| | Acrylic resin(PMMA) | 1170~1200 | 1370~1470 | 0.21 | 5.0~9.0 | 2.2~3.2 | 0.35~0.40 | 48~73 |
| | Polyimide | 1450 | 1100 | 0.18 | 1.2~1.7 | 5.3~5.7 | 0.34 | 255~355 |
| Coating | Matt black paint *¹ | 1160~1460 | 1070~1170 | 0.23~0.33 | - | - | - | - |
| | (Silicone resion) | 970~2500 | - | 0.13~0.14 | 1.0~1.9 | - | - | - |

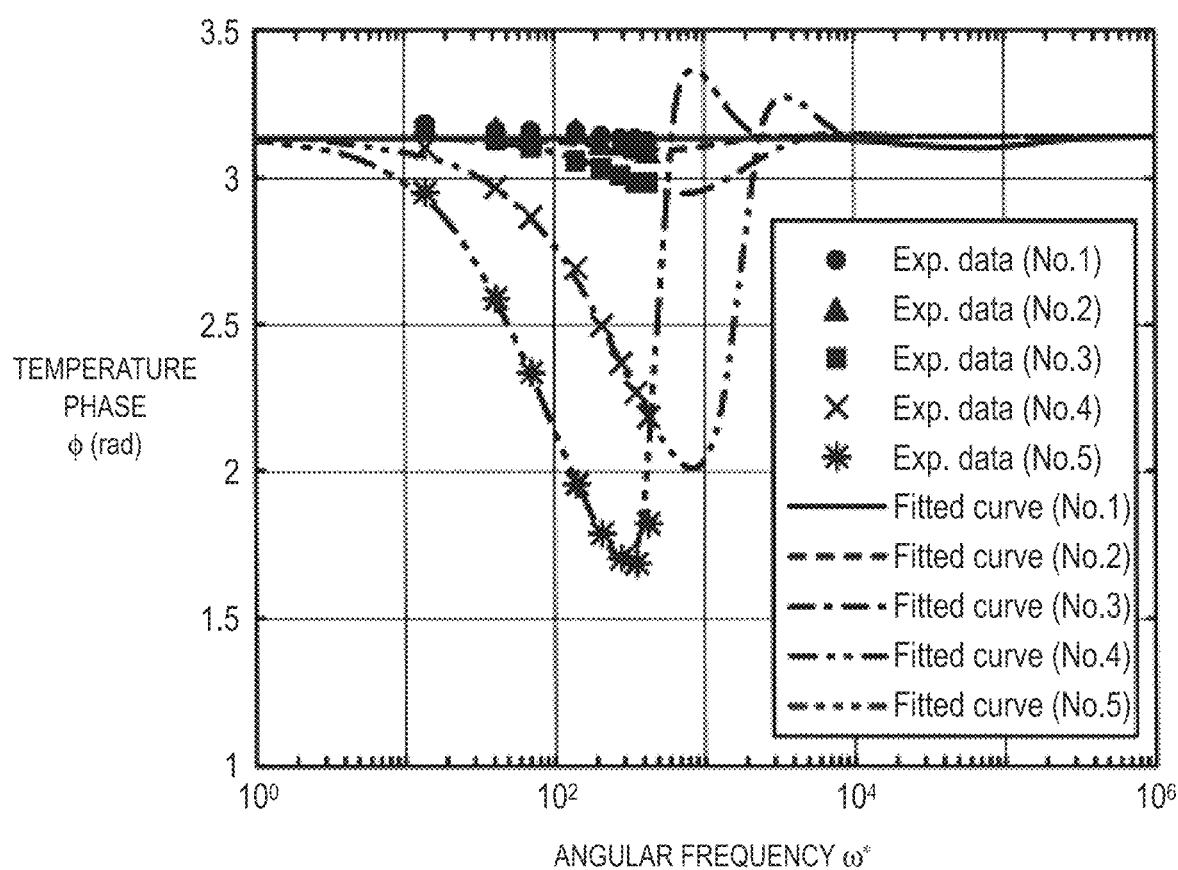

FIG. 15

| Specimen name | Calculated parameters | | | | $\sigma_m$ [MPa] | | | | | | | | | | $L_c$ [μm] | |
|---|---|---|---|---|---|---|---|---|---|---|---|---|---|---|---|---|
| | $C_1$ | $C_2$ (×10⁻⁴) | $C_3$ | $C_4$ (×10⁻⁴) | Exact | TSA | | | | | | | | Meas. | Calc. |
| | | | | | | $f=$ | 1 | 3 | 5 | 10 | 15 | 20 | 25 | 30 Hz | | |
| ABS-1 | 0.79 | 1.12 | 1.25 | 3.45 | 6.30 | | 5.63 -10% | 5.50 -12% | 5.48 -13% | 5.37 -15% | 5.29 -16% | 5.18 -18% | 5.15 -18% | 5.03 -20% | 6.9 (1.00) | 38.3 (1.00) |
| ABS-2 | 0.66 | 4.75 | 1.79 | 3.47 | | | 5.18 -18% | 4.75 -24% | 4.55 -28% | 4.38 -30% | 4.24 -33% | 4.11 -35% | 4.01 -36% | 3.87 -38% | 17.5 (2.54) | 112.8 (2.94) |
| ABS-3 | 0.59 | 8.00 | 1.90 | 3.61 | | | 4.99 -21% | 4.50 -28% | 4.25 -32% | 3.95 -37% | 3.80 -40% | 3.71 -41% | 3.61 -43% | 3.53 -44% | 30.2 (4.38) | 155.3 (4.06) |
| SUS-1 | 0.94 | 0.36 | 0.05 | 5.27 | 167 | | 119 -29% | 118 -29% | 117 -30% | 116 -30% | 116 -31% | 115 -31% | 114 -32% | 114 -32% | - | 2.7 |
| SUS-2 | 0.92 | 52.00 | 0.02 | 6.24 | | | 139 -17% | 141 -16% | 137 -18% | 135 -19% | 134 -20% | 134 -20% | 131 -22% | 131 -22% | - | 11.4 |
| SUS-3 | 0.73 | 38.79 | 0.01 | 6.81 | | | 149 -11% | 150 -10% | 149 -11% | 146 -12% | 145 -13% | 142 -15% | 140 -16% | 137 -18% | - | 5.1 |
| SUS-4 | 0.17 | 84.26 | 0.12 | 7.22 | | | 158 -5% | 151 -10% | 145 -13% | 129 -23% | 113 -32% | 100 -40% | 88 -47% | 79 -53% | - | 87.4 |
| SUS-5 | 0.13 | 330.6 | 0.05 | 6.66 | | | 144 -14% | 120 -28% | 98 -41% | 59 -65% | 37 -78% | 24 -86% | 15 -91% | 9 -95% | - | 69.1 |
| Al-1 | 0.23 | 15272 | 0 | 2.36 | 30 | | 24.90 -59% | 23.79 -61% | 22.30 -63% | 17.67 -71% | 13.86 -77% | 11.23 -82% | 9.04 -85% | 8.05 -87% | 55 (1.00) | 0 |
| Al-2 | 0.24 | 42646 | 0 | 4.24 | 60 | | 45.99 -25% | 32.95 -46% | 24.32 -60% | 14.66 -76% | 11.22 -82% | 9.55 -84% | 8.49 -86% | 7.91 -87% | 110 (2.00) | 0 |

| Calc. |
|---|
| 6.15 -2.16% |
| 6.19 -1.57% |
| 6.42 2.16% |
| 122.25 -26.79% |
| 144.75 -13.32% |
| 157.94 -5.43% |
| 167.49 0.29% |
| 154.36 -7.57% |
| 26.03 |
| 46.72 |

STRESS MEASUREMENT METHOD, STRESS MEASUREMENT DEVICE, AND STRESS MEASUREMENT SYSTEM

TECHNICAL FIELD

The present disclosure relates to a stress measurement method, a stress measurement device, and a stress measurement system for repeatedly applying a tensile stress or a compressive stress to an object to be measured, measuring a temperature amplitude of this object to be measured by using a temperature sensor, and obtaining a stress value of the object to be measured from this measurement result.

BACKGROUND ART

Conventionally, a variety of methods have been reported as an infrared stress measurement correcting method for vibrating an object to be measured including a coated substrate at a plurality of frequencies, measuring a change in surface temperature generated due to a thermoelastic effect during vibration, and measuring a stress of the object to be measured on the basis of measurement data (see, for example, NPL 1 to NPL 3).

NPL 1 describes a method for correcting a stress of an object to be measured that has been coated with a coating film. A film thickness of the coating film is smaller than a thickness of a substrate of the object to be measured, and therefore it is assumed that each of a temperature of the substrate and a temperature of the coating film is uniform. By solving a heat conduction equation under this condition, a stress value that is attenuated according to a vibration frequency is corrected. However, it has been assumed that heat is only generated in the substrate due to a thermoelastic effect but heat is not generated in the coating film due to the thermoelastic effect. It is described that a factor of attenuation of a measured stress of the object to be measured due to an increase in the vibration frequency results from a decrease in an amount of heat transferred from the substrate to the coating film according to an increase in the frequency.

In NPL 2, under the assumption of a case where a change in temperature having a sine wave shape has occurred, a study has been conducted on the basis of a one-dimensional heat conduction equation, and a result similar to a result in NPL 1 has been obtained. However, in NPL 2, it has been assumed that heat generation due to a thermoelastic effect of a coating itself can be ignored.

In NPL 3, heat generation caused by the thermoelastic effect of the coating has also been studied. Under the assumption of a case where a sufficiently thin coating has been applied onto a metal substrate, it has been assumed, by using a thermal wave theory, that waves transferred from the substrate propagate in the coating and are reflected by an interface between the substrate and the coating and an outer surface. A temperature distribution in a thickness direction has been obtained from a sum of thermal waves.

In NPLs 1 to 3, a heat generation phenomenon due to a thermoelastic effect of a coating film, a thickness of a substrate, a heat conduction state, and the like have not been considered as preconditions. Therefore, under the condition of a low heat conduction substrate or the condition of a physical property value of a coating film being close to a physical property value of a substrate, a temperature attenuation on a surface of a coating film according to a vibration frequency generated in actual results has failed to be faithfully expressed by theoretical calculation. As a result, attenuation of a stress value obtained by measurement has failed to be completely corrected.

PTL 1 discloses a stress measurement method for solving the problems described above. In the stress measurement method of PTL 1, a theoretical solution of a temperature amplitude on a surface of a coating film is derived. The theoretical solution is obtained from a one-dimensional heat conduction equation based on heat conduction and thermoelastic effects of both a substrate and the coating film. Then, the theoretical solution is curve-fitted, by using a least-squares method, to frequency characteristics of a temperature change component and a phase component based on the thermoelastic effects, the frequency characteristics being obtained at a plurality of oscillation frequencies. By doing this, a variable of the theoretical solution of the surface of the coating film is identified, and an influence of heat conduction due to the coating film is corrected. This enables a precise stress value to be obtained.

CITATION LIST

Patent Literature

PTL 1: Unexamined Japanese Patent Publication No. 2016-24057

Non-Patent Literature

NPL 1: M. H. Belgen, infrd-red radi/metric stress instrumentation application range study, NASA Report CR-1067 (1967)

NPL 2: J. Mckelvie, Consideration of the surface temperature response to cyclic thermoelastic heat generation, SPIE Vol. 731 stress Analysis by Thermoelastic Techniques (1987) 44-53.

NPL 3: A. K. Mackenzie, Effects Of Surface Coatings On Infra-Red Measurements of Thermoelastic Responses, SPIE Vol. 1084 Stress and Vibration. Recent Developments in Indudtrial Measurement and Analysis (1989) 59-71.

SUMMARY

The present disclosure provides a stress measurement method, a stress measurement device, and a stress measurement system that are capable of precisely measuring a stress of an object to be measured that includes a substrate and a coating film.

In a first aspect of the present disclosure, a stress measurement method for an object to be measured that includes a substrate and a coating film is provided. In the stress measurement method for the object to be measured, the object to be measured is vibrated at a plurality of oscillation frequencies. A temperature amplitude of the object to be measured is measured by using a temperature sensor. Parameters of a one-dimensional heat conduction equation described below are identified by performing curve-fitting, on the basis of the one-dimensional heat conduction equation, on a measurement value of a change in the temperature with respect to frequency characteristics of a temperature change component and a phase component based on a thermoelastic effect. The frequency characteristics are obtained at the plurality of oscillation frequencies. The one-dimensional heat conduction equation indicates a theoretical solution of a temperature amplitude on a surface of the coating film based on heat conduction and the thermoelastic effect of each of the substrate and the coating film.

Then, a stress of the object to be measured is obtained on the basis of the identified parameters.

$$T^*_{theory} = \frac{\hat{T}_{theory}}{T_0} = -C_4 \left[ \frac{\frac{1-C_1}{\sinh\left((1+i)\sqrt{\frac{\omega^*}{2}C_2}\right)}}{\frac{C_3}{\tanh\left((1+i)\sqrt{\frac{\omega^*}{2}}\right)} + \frac{1}{\tanh\left((1+i)\sqrt{\frac{\omega^*}{2}C_2}\right)}} + C_1 \right]$$

$$C_1 = \frac{c_1 c_4}{c_3} = \frac{\frac{E_c}{1-v_c}}{\frac{E_m}{1-v_m}} \cdot \frac{\alpha_c}{\alpha_m} \cdot \frac{\rho_m c_m}{\rho_c c_c} = \frac{\frac{E_c}{1-v_c}}{\frac{E_m}{1-v_m}} \cdot \frac{K_c}{K_m}$$

$$C_2 = \frac{c_3 c_5^2}{c_2} = \frac{\left(\frac{L_c}{L_m}\right)^2}{\frac{k_c}{k_m} \cdot \frac{\rho_m c_m}{\rho_c c_c}} = \frac{\left(\frac{L_c}{L_m}\right)^2}{\frac{\alpha_c}{\alpha_m}}$$

$$C_3 = \sqrt{c_2 c_3} = \frac{\sqrt{\rho_c c_c k_c}}{\sqrt{\rho_m c_m k_m}} = \frac{b_c}{b_m}$$

$$C_4 = \frac{c_6}{T_u} = \varepsilon K_m \sigma_m$$

Here, $T_0$ is reference temperature, $\hat{T}_{theory}$ is Fourier transform of temperature, E is a modulus of longitudinal elasticity, K is a thermoelastic constant, v is a Poisson's ratio, c is specific heat at constant pressure, k is heat conductivity, $\rho$ is density, $\alpha$ is a linear expansion coefficient, L is film thickness, and a subscript m and a subscript c respectively indicate the substrate and the coating film.

In a second aspect of the present disclosure, a stress measurement device is provided that obtains a value of a stress of an object to be measured including a substrate and a coating film on the basis of a temperature amplitude of the object to be measured that has been vibrated. The stress measurement device includes an obtaining unit that obtains the temperature amplitude, and a controller that calculates the stress of the object to be measured on the basis of the temperature amplitude. The controller obtains, from the temperature amplitude, a measurement value of a temperature amplitude on a surface of the coating film based on heat conduction and a thermoelastic effect of each of the substrate and the coating film. Further, the controller identifies parameters of the one-dimensional heat conduction equation described above by performing curve-fitting, on the basis of the one-dimensional heat conduction equation, on the measurement value of the temperature amplitude with respect to frequency characteristics of a temperature change component and a phase component based on the thermoelastic effect. The frequency characteristics are obtained at a plurality of oscillation frequencies. The one-dimensional heat conduction equation indicates a theoretical solution of the surface of the coating film. Then, the controller obtains the stress of the object to be measured on the basis of the identified parameters.

In a third aspect of the present disclosure, a stress measurement system is provided that vibrates an object to be measured that includes a substrate and a coating film, measures a temperature amplitude of the object to be measured, and obtains a value of a stress of the object to be measured from a measurement result. The stress measurement system includes a vibration generator that repeatedly applies a load to the object to be measured at a predetermined frequency, a temperature sensor that measures the temperature amplitude of the object to be measured that the load has been applied to, and an information processing device that obtains the stress of the object to be measured on the basis of the temperature amplitude that has been obtained from the temperature sensor. The information processing device identifies parameters of the one-dimensional heat conduction equation described above by performing curve-fitting, on the basis of the one-dimensional heat conduction equation, on a measurement value of the temperature amplitude with respect to frequency characteristics of a temperature change component and a phase component based on a thermoelastic effect. The frequency characteristics are obtained at a plurality of oscillation frequencies. The one-dimensional heat conduction equation indicates a theoretical solution of a temperature amplitude on a surface of the coating film based on heat conduction and the thermoelastic effect of each of the substrate and the coating film. The information processing device obtains the stress of the object to be measured on the basis of the identified parameters.

According to the present disclosure, a stress of an object to be measured that includes a substrate and a coating film can be precisely measured.

BRIEF DESCRIPTION OF DRAWINGS

FIG. 6 is a diagram illustrating a first reference table indicating a relationship between respective ranges of $\omega^*$ and $C_1$ to $C_4$ and a probability of a maximum error obtained in inverse analysis using parameters within the respective ranges being less than 10% ($\omega^*=1\times10^2$ to $1\times10^4$).

FIG. 7 is a diagram illustrating a second reference table indicating a relationship between respective ranges of $\omega^*$ and $C_1$ to $C_4$ and a probability of an error of $C_4$ obtained in inverse analysis using parameters within the respective ranges being less than 10% ($\omega^*=1\times10^{-2}$ to $1\times10^0$).

FIG. 9 is a diagram illustrating physical property values with respect to a variety of substrates and coating materials.

FIG. 13B is a diagram illustrating fitting results of a temperature phase with respect to five test pieces of a stainless substrate.

FIG. 15 is a diagram illustrating an analysis result.

DESCRIPTION OF EMBODIMENTS

Exemplary embodiments are described in detail below with reference to the drawings as appropriate. An unnecessarily detailed description may be omitted. For example, a detailed description of a well-known matter and a duplicated description of substantially the same configuration may be omitted. This is to avoid unnecessary redundancy in the description below and to make the description below easily understandable to those skilled in the art.

Note that the inventors provide the accompanying drawings and the description below to help those skilled in the art to fully understand the present disclosure, and do not intend to use the accompanying drawings or the description below to limit the subject matter described in the claims.

First Exemplary Embodiment

A stress measurement system according to the present exemplary embodiment is a system that measures a principal stress sum of an object to be measured that includes a substrate and a coating material applied onto a surface of the substrate. Specifically, a theoretical solution of a temperature amplitude on a surface of a coating film is derived. The theoretical solution is obtained from a one-dimensional heat conduction equation in consideration of heat conduction and a thermoelastic effect of both the substrate and the coating material. The theoretical solution is curve-fitted to frequency characteristics of a temperature change component and a phase component based on the thermoelastic effect, the frequency characteristics being obtained from measurement data that has been obtained due to vibration at a plurality of oscillation frequencies. By doing this, respective variables (coefficients) of the theoretical solution of the surface of the coating film are identified, and a principal stress sum of the object to be measured and a physical property value of a substrate material are obtained from the identified variables.

1-1. Configuration

An exemplary embodiment of a stress measurement system according to the present disclosure is described below with reference to the accompanying drawings.

Figure 1:
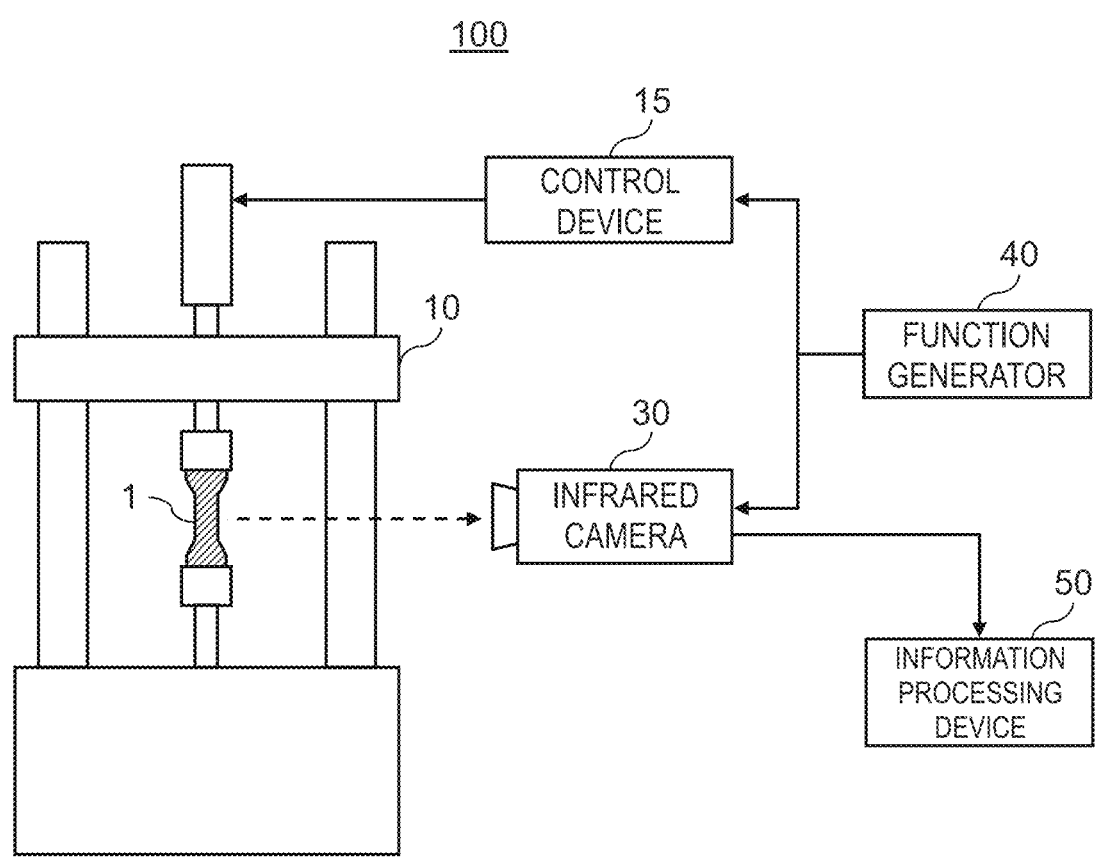
FIG. 1 is a diagram illustrating an entire configuration of a stress measurement system according to the present disclosure.

FIG. 1 is a diagram illustrating a configuration of a stress measurement system according to a first exemplary embodiment. Stress measurement system 100 includes vibration generator 10, control device 15, and function generator 40. Vibration generator 10 vibrates test piece 1 serving as an example of an object to be measured according to the present disclosure at a predetermined frequency. Control device 15 controls a vibration operation of vibration generator 10. Function generator 40 outputs a vibration waveform.

Further, stress measurement system 100 includes infrared camera 30 and information processing device 50 (an example of a stress measurement device according to the present disclosure). Infrared camera 30 captures a temperature image (an infrared image) of test piece 1 that has been vibrated. Information processing device 50 analyzes the temperature image, and calculates a principal stress sum, a physical property value, or the like of test piece 1.

An output signal of function generator 40 is input to infrared camera 30 in addition to control device 15. Control device 15 controls a vibration frequency of vibration generator 10 on the basis of the output signal from function generator 40. By doing this, a captured image of infrared camera 30 and a vibration frequency applied to test piece 1 are synchronized with each other.

Figure 2:
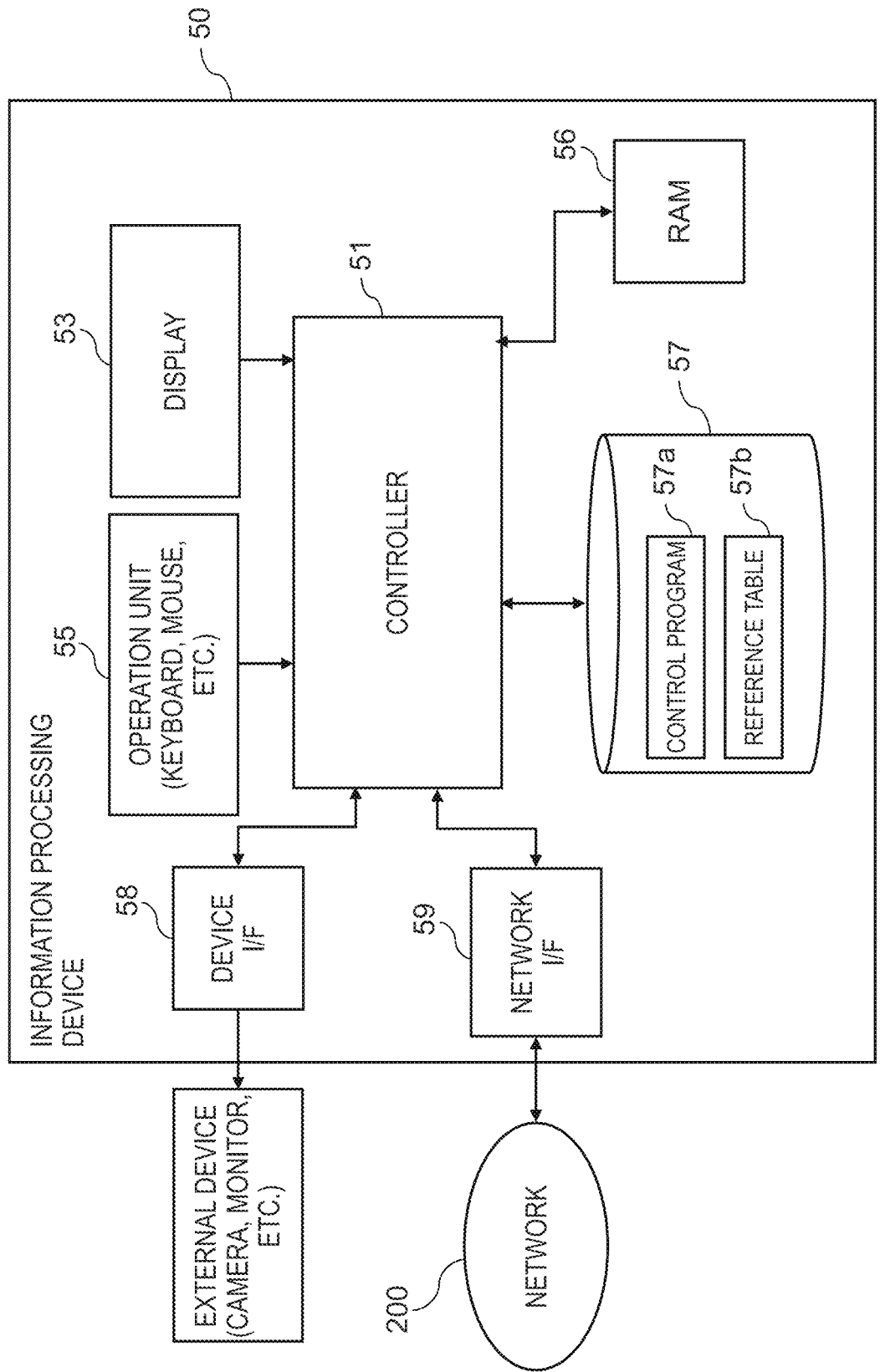
FIG. 2 is a diagram illustrating a configuration of an information processing device in the stress measurement system.

FIG. 2 is a block diagram explaining an internal configuration of information processing device 50. Information processing device 50 is, for example, a personal computer. Information processing device 50 includes controller 51 that controls an entire operation of information processing device 50, display 53 that displays information, operation unit 55 that is used for a user to perform an operation, and random access memory (RAM) 56 and data storage 57 that store data or a program.

Information processing device 50 further includes device interface 58 (an example of an obtaining unit according to the present disclosure) for connection to an external device such as infrared camera 30, and network interface 59 (an example of the obtaining unit according to the present disclosure) for connection to a network. Device interface 58 is a communication module (a circuit) that communicates data or the like according to universal serial bus (USB), high-definition multimedia interface (HDMI) (registered trademark), IEEE 1394, or the like. Network interface 59 is a communication module (a circuit) that performs data communication according to standards such as IEEE 802.11, WiFi, Bluetooth (registered trademark), 3G, 4G, long term evolution (LTE), or the like.

Controller 51 (an example of an arithmetic unit) includes a central processing unit (CPU) or a micro-processing unit (MPU), and realizes predetermined functions by executing predetermined control program 57a that is stored in data storage 57.

Display 53 is, for example, a liquid crystal display or an organic electroluminescence (EL) display.

RAM 56 is a storage element that transitorily stores a program or data, and functions as a working area of controller 51.

Data storage 57 is a recording medium that stores a parameter, data, and a program that are needed to realize functions. Data storage 57 stores a control program that is executed by controller 51 or various types of data. Data storage 57 includes, for example, a hard disk drive (HDD), a solid state drive (SSD), or an optical disc medium. Control program 57a is installed in data storage 57. Controller 51 realizes the functions described later by executing control program 57a described above. Data storage 57 also functions as a working area of controller 51.

Data storage 57 stores measurement data and reference table 57b that is referred to when fitting is performed on the measurement data. Reference table 57b is a table that indicates a probability of obtaining a correct solution for each combination of an angular frequency and respective ranges of coefficients of a one-dimensional heat conduction equation (details are described later).

1-2. Operation

An operation of stress measurement system 100 configured as described above is described below.

In the present exemplary embodiment, in a case where a uniform uniaxial stress having a sine wave shape is generated in a substrate that has a coating applied on a single side and that has fixed thickness Lm, one-dimensional heat conduction theoretical analysis in a thickness direction is performed, and a theoretical solution of temperature on a surface of the coating is derived.

Figure 3A:
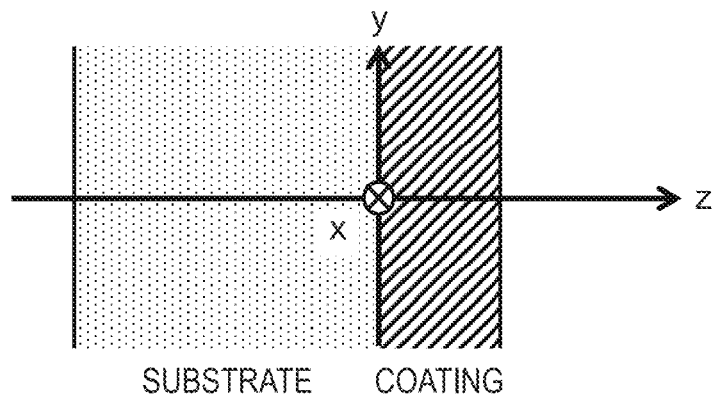
FIG. 3A is a diagram illustrating a one-dimensional uniaxial tension theoretical analysis model in consideration of only heat conduction in a thickness direction according to the present disclosure.
Figure 3B:
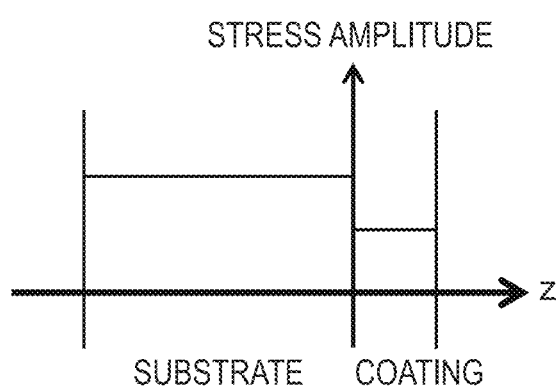
FIG. 3B is a diagram illustrating a stress amplitude of an object to be measured according to the present disclosure.
Figure 3C:
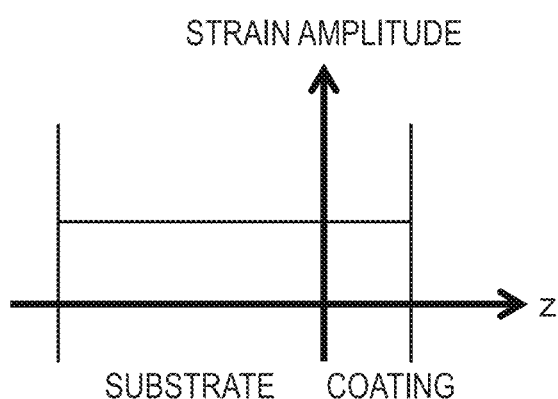
FIG. 3C is a diagram illustrating a distortion amplitude of an object to be measured according to the present disclosure.

FIG. 3A is a diagram illustrating a one-dimensional uniaxial tension theoretical analysis model in consideration of only heat conduction in a thickness direction according to the present exemplary embodiment. In an object to be measured that has a coating applied on a single side of a substrate, as illustrated in FIG. 3A, an origin is set on an outer surface of the substrate (an interface between the substrate and the coating), and it is assumed that a load direction is a y-axis, a direction in a substrate surface that is perpendicular to the load direction is an x-axis, and a thickness direction of the substrate is a z-axis. Only a vertical stress in a y-axis direction acts on the substrate, the vertical stress is uniform in a z-axis direction, and a magnitude of the vertical stress changes in a sine wave shape. It can be considered that the coating is deformed in synchronization with deformation of the substrate. It is assumed that a strain generated in the coating is always equal to a strain of the substrate and is uniform in the z-axis direction. Stated another way, stress amplitudes in the substrate and the coating are assumed as illustrated in FIG. 3B. Then, strain amplitudes in the substrate and the coating are assumed as illustrated in FIG. 3C.

Stress measurement using stress measurement system 100 according to the present exemplary embodiment is performed according to the procedure described below.

1) Measurement of Temperature Characteristics Due to Vibration of Test Piece

Test piece 1 is vibrated at a plurality of vibration frequencies, and a change in a temperature on a surface of an object to be measured during vibration is measured by using infrared camera 30 (obtainment of measurement data).

2) Inverse Analysis Using Theoretical Solution to One-Dimensional Heat Conduction Equation Next, a theoretical solution of a temperature amplitude on a surface of a coating film is derived. The theoretical solution is obtained from a one-dimensional heat conduction equation in consideration of heat conduction and thermoelastic effects of both a substrate and a coating material. Then, the theoretical solution is curve-fitted to frequency characteristics of a temperature change component and a phase component based on the thermoelastic effects, the frequency characteristics being obtained from measurement data obtained due to vibration at the plurality of oscillation frequencies, so that respective variables (coefficients) of the theoretical solution to the one-dimensional heat conduction equation are identified.

3) Calculation of Principal Stress Sum and the Like

Thereafter, a principal stress sum of the object to be measured is obtained from the respective identified variables. At this time, a physical property value of the coating material of the object to be measured can also be obtained from the respective identified variables.

The respective procedures (1) to (3) described above are described in more detail below.

(1) Measurement of Temperature Characteristics Due to Vibration of Test Piece

Test piece 1 serving as an object to be measured includes a substrate and a coating film formed on a surface of the substrate. Test piece 1 is set in vibration generator 10. Control device 15 controls vibration generator 10 on the basis of a vibration signal from function generator 40. Specifically, control device 15 controls vibration generator 10 in such a way that vibration generator 10 repeatedly applies a tensile stress or a compressive stress to test piece 1 at each of a plurality of types of vibration frequencies.

Infrared camera 30 photographs test piece 1 to which the tensile stress or the compressive stress has been applied at each of the vibration frequencies so as to generate a temperature image. Data processing is performed on the temperature image measured by infrared camera 30 in information processing device 50 having a Fourier transform function. Information processing device 50 obtains a principal stress sum, a physical property value, and the like of test piece 1 (the substrate) on the basis of the temperature image (an infrared image) captured by infrared camera 30.

Figure 4A:
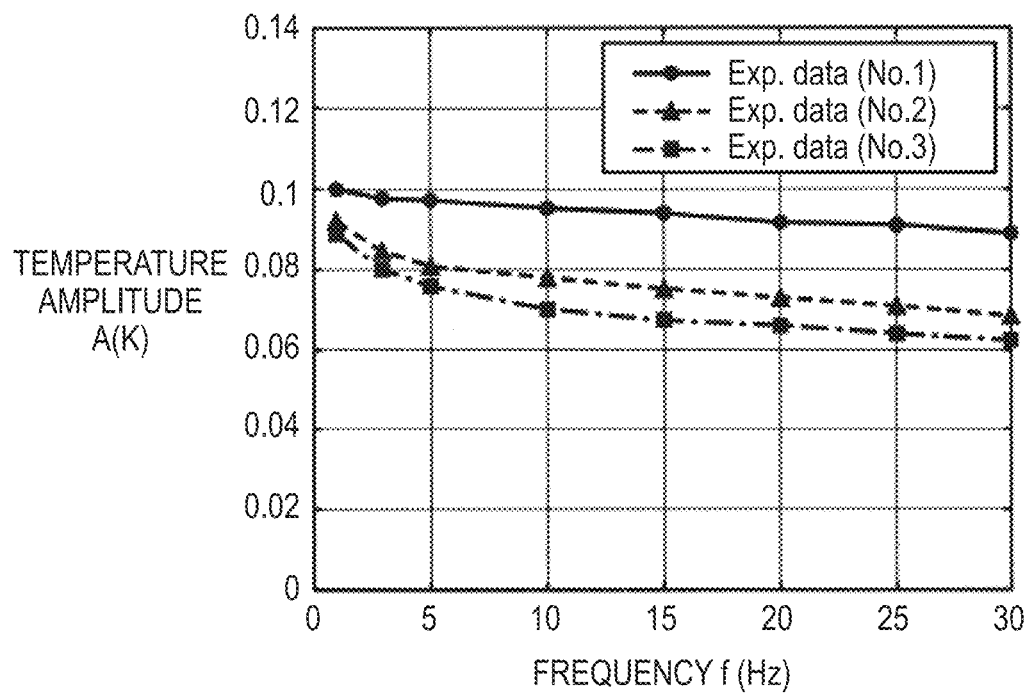
FIG. 4A is a diagram illustrating a temperature characteristic obtained from measurement data using an infrared image.
Figure 4B:
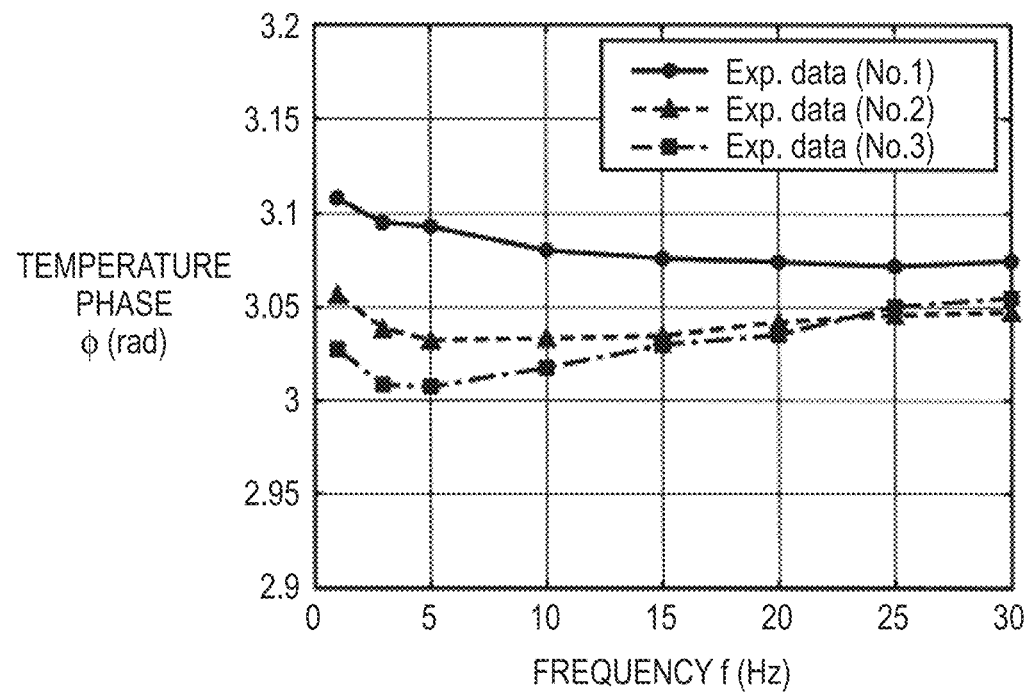
FIG. 4B is a diagram illustrating a phase characteristic obtained from measurement data using an infrared image.

Specifically, information processing device 50 captures a temperature image from infrared camera 30 in a temporally continuous manner, and information processing device 50 performs Fourier transform on the temperature image in pixel units so as to generate temperature amplitude data and temperature phase data. FIG. 4A illustrates an example of the temperature amplitude data obtained as described above. FIG. 4B illustrates an example of the temperature phase data (a phase delay). The results illustrated in FIGS. 4A and 4B relate to test pieces each including an acrylonitrile butadiene styrene (ABS) resin substrate that has been coated with black paint. In FIGS. 4A and 4B, No. 1 to No. 3 indicate pieces of data of three types of test pieces in which coating films have thicknesses different from each other.

(2) Inverse Analysis Using Theoretical Solution to One-Dimensional Heat Conduction Equation Information processing device 50 performs curve-fitting on the temperature amplitude data and the temperature phase data that have been obtained from measurement data, as described above, by using a one-dimensional heat conduction equation so as to obtain respective variables of the one-dimensional heat conduction equation. A one-dimensional heat conduction equation to be used in the present exemplary embodiment is described below.

A one-dimensional heat conduction equation to be used in information processing device 50 according to the present exemplary embodiment is expressed as formula (1) described below. In the following formula, temperature $T\hat{}_{theory}$ indicates a value obtained by performing Fourier transform on temperature. A theoretical solution of temperature is indicated by an expression ($T^*_{theory}$) that has been obtained by making temperature $T_{theory}$ dimensionless by using initial temperature $T_0$.

[Formula 2]

$$T^*_{theory} = \frac{\hat{T}_{theory}}{T_0} = -C_4 \left[ \frac{1-C_1}{\frac{C_3}{\tanh\left((1+i)\sqrt{\frac{\omega^*}{2}}\right)} + \frac{1}{\tanh\left((1+i)\sqrt{\frac{\omega^*}{2}C_2}\right)}} + C_1 \right]$$

Four dimensionless constants $C_1$ to $C_4$ are respectively expressed as the following.

[Formula 3]

$$C_1 = \frac{c_1 c_4}{c_3} = \frac{\frac{E_c}{1-v_c}}{\frac{E_m}{1-v_m}}, \frac{\alpha_c}{\alpha_m} \cdot \frac{\rho_m c_m}{\rho_c c_c} = \frac{\frac{E_c}{1-v_c}}{\frac{E_m}{1-v_m}}, \frac{K_c}{K_m} \quad (2a)$$

$$C_2 = \frac{c_3 c_5^2}{c_2} = \frac{\left(\frac{L_c}{L_m}\right)^2}{\frac{k_c}{k_m} \cdot \frac{\rho_m c_m}{\rho_c c_m}} = \frac{\left(\frac{L_c}{L_m}\right)^2}{\frac{\alpha_c}{\alpha_m}} \quad (2b)$$

$$C_3 = \sqrt{c_2 c_3} = \frac{\sqrt{\rho_c c_c k_c}}{\sqrt{\rho_m c_m k_m}} = \frac{b_c}{b_m} \quad (2c)$$

$$C_4 = \frac{c_6}{T_0} = \varepsilon K_m \sigma_m \quad (2d)$$

In the present disclosure, inverse analysis is performed using function $T^*_{theory}(C_1, C_2, C_3, C_4)$ of four parameters as a model function on the basis of formula (1). Amplitude $A^*_{theory}$ and phase $\varphi_{theory}$ that have been made dimensionless of a temperature on a coating surface are expressed as the following formulae.

[Formula 4]

$$A^*_{theory} = |T^*|$$

$$\varphi_{theory} = \arg T^* (-\pi \leq \varphi_{theory} \leq \pi) \quad (3)$$

Figure 5A:
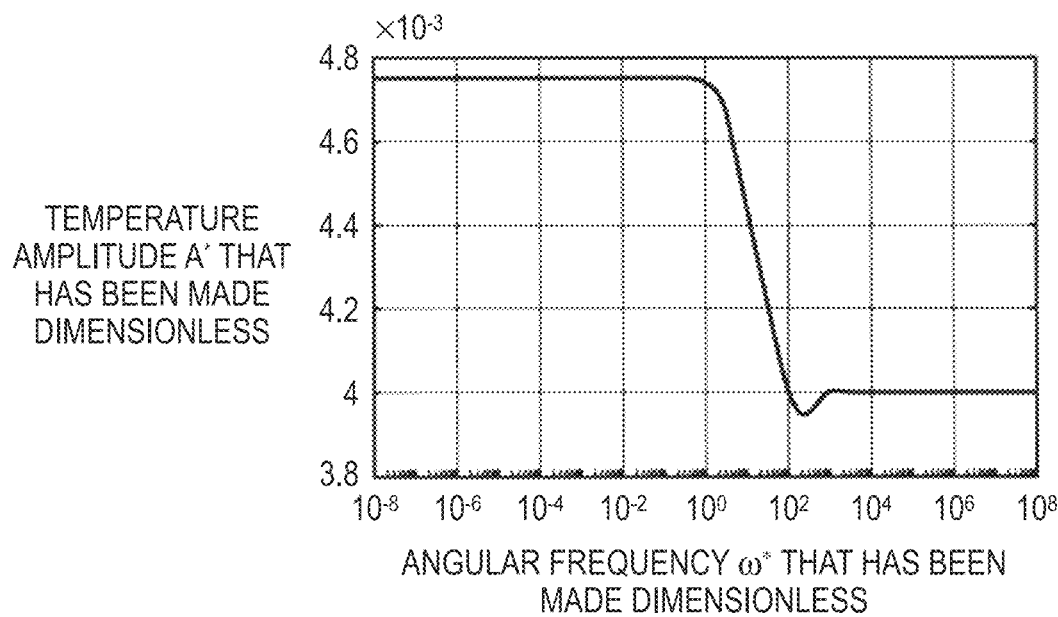
FIG. 5A is a diagram illustrating a temperature amplitude characteristic derived on the basis of a one-dimensional heat conduction equation.
Figure 5B:
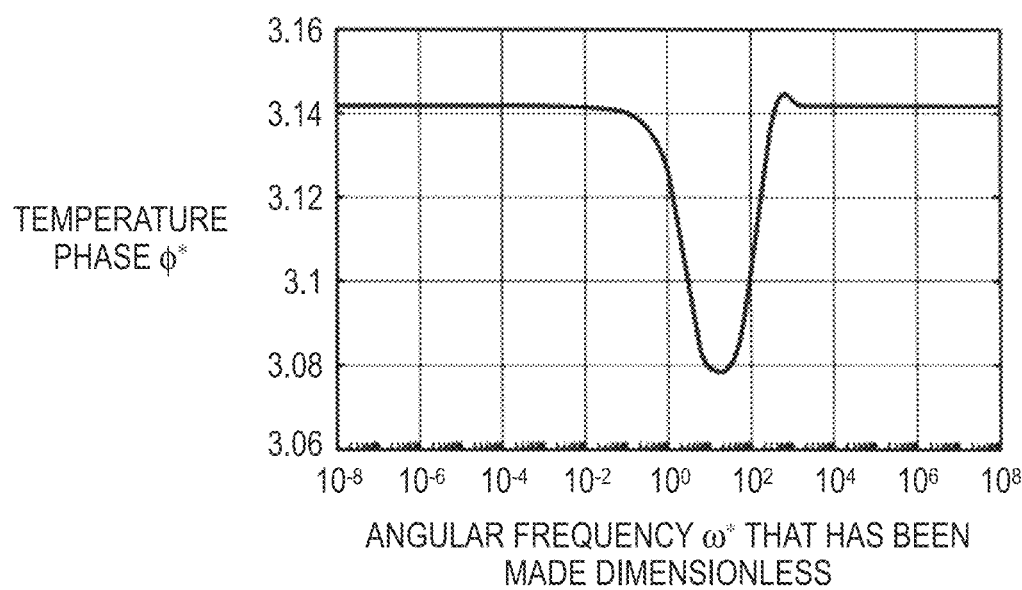
FIG. 5B is a diagram illustrating a temperature phase characteristic derived on the basis of a one-dimensional heat conduction equation.

As an example, an amplitude and a phase of a temperature on the coating surface in a case where $C_1=0.80$, $C_2=0.05$, $C_3=1.50$, and $C_4=0.005$ are illustrated in FIGS. 5A and 5B, respectively. In FIG. 5A, an amplitude of a vertical axis has been made dimensionless. In addition, in both FIG. 5A and FIG. 5B, a horizontal axis indicates a dimensionless angular frequency, and the dimensionless angular frequency is indicated by a logarithmic expression.

Information processing device 50 performs inverse analysis by using a theoretical solution of a temperature on the coating surface so as to identify a principal stress sum of the substrate from measurement data of a change in the temperature on the coating surface, the measurement data having been obtained by infrared camera 30. Information processing device 50 needs to solve a four-dimensional inverse problem using $C_1$, $C_2$, $C_3$, and $C_4$ in formula (1) as variables in a process of identifying the principal stress sum of the substrate. The principal stress sum of the substrate is obtained by substituting an identified value of $C_4$ in formula (2d). In addition, if identified values of $C_2$ and $C_3$ are used, a thermophysical property value and film thickness Lc of a coating can be identified. For example, a case is assumed where heat capacity $\rho_m c_m$, heat conductivity $k_m$, and thickness $L_m$ of the substrate are known. When $C_2$ and $C_3$ are obtained, if one of two, the thermophysical property value and the thickness, is known, a remaining value can be obtained. Stated another way, in the present exemplary embodiment, inverse analysis can be performed to obtain $C_1$, $C_2$, $C_3$, and $C_4$, and a thermophysical property value and a film thickness of a coating material in addition to the principal stress sum of the substrate can be identified from these values.

The present exemplary embodiment defines an objective function of an inverse problem (a nonlinear least-squares problem) of obtaining $C_1$, $C_2$, $C_3$, and $C_4$ from measurement data of a temperature on a surface of the coating based on a temperature image captured by infrared camera 30 by using a theoretical solution of the temperature on the surface of the coating.

Stated another way, a uniaxial tension repeated load is applied to the substrate that has been coated at p vibration frequencies $f_i$ (i=1, 2, ..., p). A temperature on the surface of the coating is measured by using infrared thermography, and data of temperature amplitude ($A_i$) and phase delay ($\varphi_i$) is obtained. Next, the obtained data is converted as described below in order to use a theoretical solution to a one-dimensional heat conduction equation (see formula (1)) for fitting. First, vibration frequency $f_i$ is converted into dimensionless angular frequency $\omega^*_i$ on the basis of $\omega=2\pi f$. On the other hand, temperature amplitude ($A_i$) and phase delay ($\varphi_i$) are converted into dimensionless temperature data $b^*_i$.

[Formula 5]

$$b^*_i = A_i e^{i\varphi}/T_0 \quad (4)$$

Here, $T_0$ is an initial temperature of the substrate and the coating material. Data point ($\omega^*_i$, $b^*_i$) (i=1, 2, ..., p) that has been obtained as described above is used in inverse analysis.

On the other hand, model function $T^*_i$ using $Cx=[C_1, C_2, C_3, C_4]^T$ as a variable is defined as described below for each $\omega^*_i$ (i=1, 2, ..., p).

[Formula 6]

$$T^*_i(Cx) = -C_4 \left[ \frac{1-C_1}{\frac{C_3}{\tanh\left((1+i)\sqrt{\frac{\omega^*_i}{2}}\right)} + \frac{1}{\tanh\left((1+i)\sqrt{\frac{\omega^*_i}{2}C_2}\right)}} + C_1 \right] \quad (5)$$

Then, objective function F is defined as described below as a residual sum of squares of model function $T^*_i$ and dimensionless temperature data $b^*_i$.

[Formula 7]

$$F(Cx) = \sum_{i=1}^{p} \|T^*_i(Cx) - b^*_i\|^2 (i = 1, 2, \ldots, p) \quad (6)$$

In formula (6) described above, by obtaining Cx that makes F(Cx) become minimum by using a least-squares method, identified value $Cx^*=[C_1^*, C_2^*, C_3^*, C_4^*]^T$ (namely, variables $C_1$ to $C_4$ in formula (1)) is obtained. As an example of the least-squares method, a trust region method can be used in a case where there are no constraints, and a trust region reflective method can be used in a case where there are constraints. Here, the "case where there are constraints" refers to a case where a physical property value that configures variables has been measured in advance or a case where a possible range of the physical property value is known. For example, this is because film thickness $L_c$ of the coating material can be measured in advance in some cases. The "case where there are no constraints" refers to a case where the physical property value that configures the variables fails to be measured in advance or a case where the possible range of the physical property value is not known.

(3) Calculation of Principal Stress Sum and the Like

If an identified value of C*x is obtained, the principal stress sum of the substrate can be obtained from the identified value of $C_4$ according to formula (2d). In addition, identified values of thermal diffusivity and a film thickness in a case where a heat capacity of the coating is known can be obtained according to the following formulae.

[Formula 8]

$$\sigma_m = \frac{C_4^*}{\varepsilon K_m} \quad (7a)$$

$$\frac{k_c}{k_m} = \frac{C_3^{*2}}{r_{pc}} \quad (7b)$$

$$\frac{L_c}{L_m} = \frac{C_3\sqrt{C_2}}{r_{pc}} \quad (7c)$$

It can be considered from a shape of formula (5) that an inverse problem of objective function F defined by formula (6) has a high nonlinearity. Stated another way, there are many minimal values in formula (5), and a case is conceivable where there is no clue to setting of an appropriate initial point. Accordingly, the inventors of the present application have investigated in advance a relationship between a range of each parameter and a probability of obtaining a solution. Information indicating a result of investigation is stored as reference table 57b in data storage 57 of information processing device 50.

Originally, data point $(\omega^*_i, b^*_i)=1, 2, \ldots, p)$ to be used in inverse analysis needs to be obtained by measurement. However, here, for the purpose of investigating the nature of objective function F, certain exact value $C^*x_{exact}$ and dimensionless angular frequency $(\omega^*_i)$ $(i=1, 2, \ldots, p)$ have been assumed and have been substituted in formula (6) so as to obtain $b^*_i$ $(=T^*_i(Cx^*_{exact}))$ and an obtained value has been assumed to be a data point. This series of operations is referred to as forward analysis. Inverse analysis has been performed using the data point generated in this forward analysis, and variables $C_1$ to $C_4$ have been identified. Then, errors $e_n$ between identified values of variables $C_1$ to $C_4$ and respective exact values have been obtained.

[Formula 9]

$$e_n[\%] = \frac{C_n^* - C_{n,exact}}{C_{n,exact}} \times 100 \quad (n = 1, 2, 3, 4) \quad (8)$$

A maximum value of errors $e_n$ (n=1, 2, 3, 4) with respect to $C_1$ to $C_4$ has been determined as maximum error $e_{max}$.

[Formula 10]

$$e_{max} = \max\{|e_1|, |e_2|, |e_3|, |e_4|\} \quad (9)$$

The inventors of the present application have investigated a relationship between ranges of respective parameters of $\omega^*$ and $C_1$ to $C_4$ and a probability of a value of maximum error $e_{max}$ obtained when inverse analysis is performed using values within these ranges becoming less than or equal to 10%. Information indicating this relationship is stored as a reference table in data storage 57 of information processing device 50. Hereinafter, this reference table indicating the relationship between the ranges of the respective parameters and the probability of the value of maximum error $e_{max}$ becoming less than or equal to 10% is referred to as a "first reference table". In the present exemplary embodiment, a first reference table has been prepared for each of a plurality of ranges of $\omega^*$. FIG. 6 is a diagram illustrating an example of a first reference table for a range of $\omega^*$ of $1\times10^2$ to $1\times10^4$. Information processing device 50 also includes a first reference table for another range of $\omega^*$, but this is not illustrated.

For example, when the first reference table illustrated in FIG. 6 is referred to, in a case where inverse analysis is performed by using a value within a range of $1\times10^2$ to $1\times10^4$ as $\omega^*$, a value within a range of $1\times10^0$ to $1\times10^1$ as $C_1$, a value within a range of $1\times10^{-4}$ to $1\times10^{-3}$ as $C_2$, a value within a range of $1\times10^0$ to $1\times10^1$ as $C_3$, and a value within a range of $1\times10^{-4}$ to $1\times10^{-3}$ as $C_4$, a probability of maximum error $e_{max}$ becoming less than 10% is 51%. This indicates that a probability of $C_1$ to $C_4$ being able to be precisely identified is low. In contrast, in a case where inverse analysis is performed by using a value within $1\times10^2$ to $1\times10^4$ as $\omega^*$, a value within a range of $1\times10^{-1}$ to $1\times10^0$ as $C_1$, a value within a range of $1\times10^{-3}$ to $1\times10^{-2}$ as $C_2$, a value within a range of $1\times10^{-1}$ to $1\times10^0$ as $C_3$, and a value within a range of $1\times10^{-3}$ to $1\times10^{-2}$ as $C_4$, a probability of maximum error $e_{max}$ becoming less than 10% is 97%. This indicates that the probability of $C_1$ to $C_4$ being able to be precisely identified is high.

The inventors of the present application have investigated a relationship between ranges of respective parameters of $\omega^*$ and $C_1$ to $C_4$ and a probability of a value of error $e_4$ relating to $C_4$ that is obtained when inverse analysis is performed using values within these ranges becoming less than or equal to 10%. Information indicating this relationship is stored as a reference table in data storage 57 of information processing device 50. Hereinafter, this reference table indicating the relationship between the ranges of the respective parameters and the probability of the value of error $e_4$ relating to $C_4$ becoming less than or equal to 10% is referred to as a "second reference table". In the present exemplary embodiment, a second reference table has been prepared for each of a plurality of ranges of $\omega^*$. FIG. 7 illustrates an example of the second reference table. FIG. 7 is a diagram illustrating an example of a second reference table for a range of $\omega^*$ of $1\times10^{-2}$ to $1\times10^0$. Information processing device 50 also includes a second reference table for another range of $\omega^*$, but this is not illustrated.

When the second reference table illustrated in FIG. 7 is referred to, in a case where inverse analysis is performed by using a value within a range of $1\times10^{-2}$ to $1\times10^0$ as $\omega^*$, a value within a range of $1\times10^0$ to $1\times10^1$ as $C_1$, a value within a range of $1\times10^{-3}$ to $1\times10^{-2}$ as $C_2$, a value within a range of $1\times10^{-3}$ to $1\times10^{-2}$ as $C_3$, and a value within a range of $1\times10^{-3}$ to $1\times10^{-2}$ as $C_4$, a probability of error $e_4$ becoming less than 10% is 100%. This indicates that a probability of $C_4$ being able to be precisely identified is significantly high.

Here, in a case where the principal stress sum is calculated, it is sufficient if $C_4$ can be precisely identified. Therefore, as described below in <1-2-1. Method for calculating principal stress sum>, it is sufficient if the "second reference table" is used in processing for calculating the principal stress sum. The second reference table has a wider application range of a coating material that enables $C_4$ to be precisely identified than an application range of the first reference table.

On the other hand, in a case where a thermophysical property value of the coating film is calculated, $C_2$ needs to be precisely identified. In addition, in order to calculate a film thickness of the coating film, $C_3$ needs to be precisely identified. Therefore, as described below in <1-2-2. Method for calculating thermophysical property value or film thickness of coating film>, the "first reference table" needs to be used in processing for calculating the thermophysical property value or the film thickness of the coating film.

<1-2-1. Calculation of Principal Stress Sum>

Figure 8:
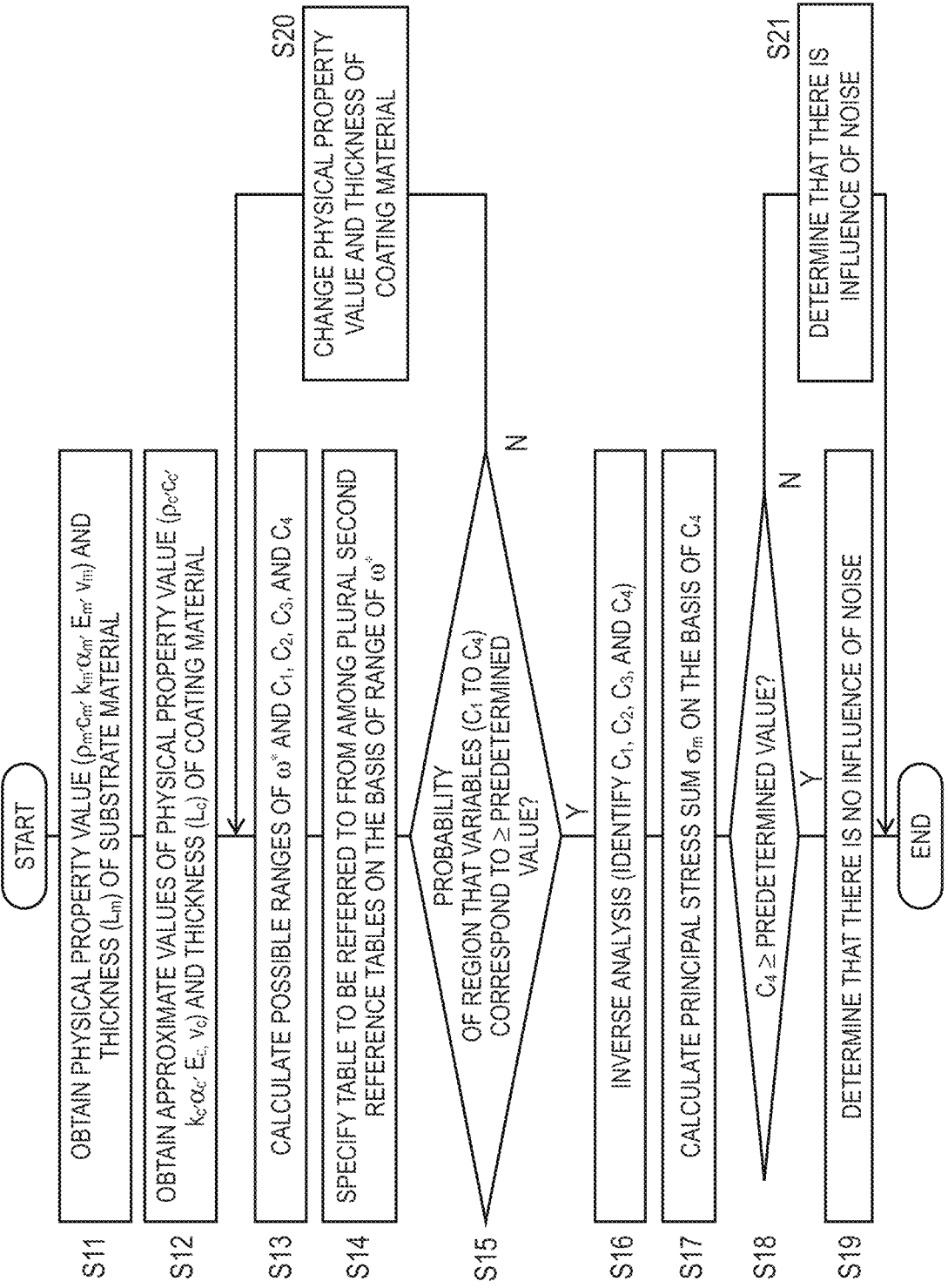
FIG. 8 is a flowchart illustrating processing for calculating a principal stress sum in an information processing device.

FIG. 8 is a flowchart illustrating processing for calculating a principal stress sum in information processing device 50. The processing for calculating the principal stress sum is described below with reference to this flowchart. This processing is performed by controller 51 of information processing device 50.

Controller 51 first obtains physical property value ($\rho_m$, $c_m$, $k_m$, $\alpha_m$, $E_m$, $v_m$) and thickness ($L_m$) of a substrate material (step S11). A physical property value or the like of the substrate material or the coating material can be given in various data forms. These pieces of data may be input via operation unit 55 by a user, or may be input to information processing device 50 via network 200.

Next, controller 51 obtains approximate values of physical property value ($\rho_c$, $c_c$, $k_c$, $\alpha_c$, $E_c$, $v_c$) and thickness ($L_c$) of the coating material (step S12). In general, it is difficult to obtain an exact value of the physical property value of the coating material, and therefore it is sufficient if an approximate value (to the extent that an order can be recognized) is used.

In FIG. 9, physical property values ($\rho$, $c_p$, k, $\alpha$, E, v) for a variety of substrates and coating materials are illustrated. $\rho$ is density, $c_p$ is specific heat at constant pressure, k is heat conductivity, $\alpha$ is a linear expansion coefficient, E is a modulus of longitudinal elasticity, v is a Poisson's ratio, and $\sigma_B$ is a tensile strength. As the substrate material, two or three representative materials from among metal, ceramics, and polymer materials are illustrated. As the coating material, values of black paint and polyimide are illustrated. In addition, a principal component of black paint is silicone resin, and therefore a physical property value of silicone resin is also indicated as a reference value.

Figure 10:
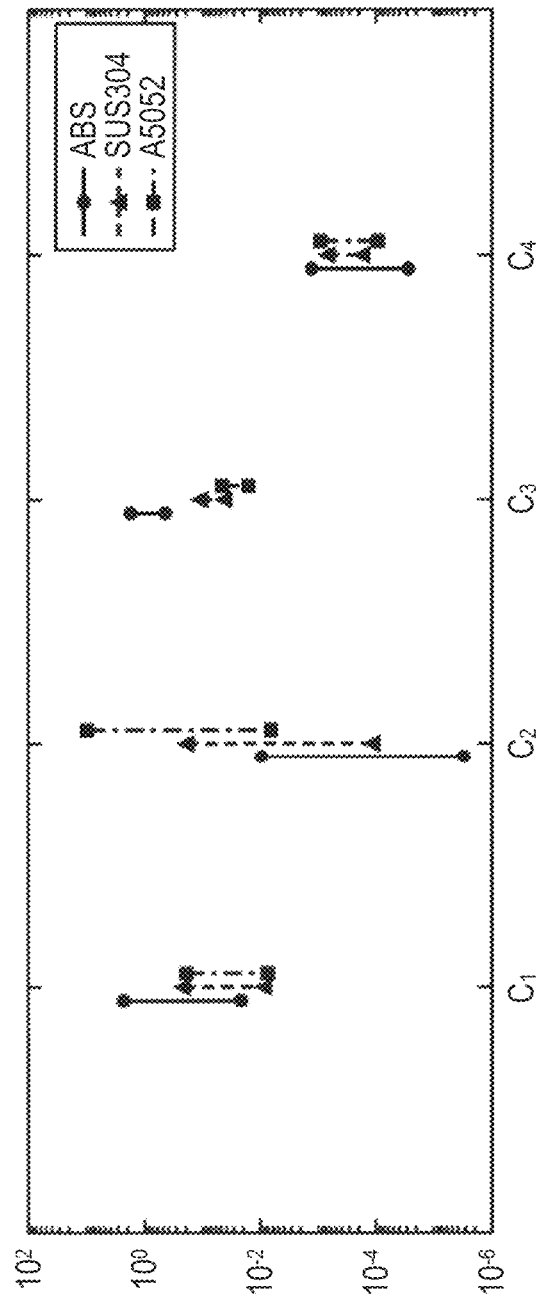
FIG. 10 is a diagram illustrating an example of possible ranges of $C_1$ to $C_4$.

Controller 51 calculates possible ranges of respective parameters of $\omega^*$ and $C_1$ to $C_4$ (step S13). Controller 51 calculates respective possible ranges of variables $C_1$ to $C_4$ according to formulae (2a) to (2d). FIG. 10 illustrates possible ranges of variables $C_1$ to $C_4$ in a case where ABS, SUS304, and A5052 are used as the substrate material. In addition, controller 51 calculates a range of $\omega^*$ by using vibration frequency f, thickness $L_m$, and thermal diffusivity $a_m$ on the basis of the formula described below.

[Formula 11]

$$\omega^* = \frac{\omega L_m^2}{\alpha_m} \quad (10)$$

Next, controller 51 selects one table of a plurality of second reference tables (see FIG. 7) on the basis of a range of angular frequency $\omega^*$ (step S14).

Controller 51 determines whether a probability for a region that corresponds to respective variables $C_1$ to $C_4$ in the selected table is greater than or equal to a predetermined value (for example, 70%) (step S15). Here, when the second reference table is referred to, probability ($e_4$) for variable $C_4$ is 100% over a wide region. Here, in a case where probability ($e_4$) is greater than or equal to approximately 70%, $C_4$ is often obtained precisely in inverse analysis. Thus, the predetermined value is set to, for example, 70%.

In a case where a probability for a corresponding region is less than the predetermined value (NO in step S15), a physical property value and a thickness of a coating material are newly set by a user (step S20), and the processing returns to step S13. By doing this, ranges of the respective variables are reset, and a second reference table is selected again.

In contrast, in a case where the probability for the corresponding region is greater than or equal to the predetermined value (YES in step S15), controller 51 performs inverse analysis by using formula (7) while changing values of variables $C_1$ to $C_4$ within ranges specified in the selected second reference table, and identifies variables $C_1$ to $C_4$ (step S16).

When identified values of variables $C_1$ to $C_4$ are obtained, controller 51 calculates principal stress sum $\sigma_m$ on the basis of $C_4$ by using formula (8a) (step S17). By doing this, principal stress sum $\sigma_m$ is obtained.

Here, an infrared image includes noise due to infrared camera 30. Therefore, if a value of $C_4$ obtained in inverse analysis is less than a level of the noise, the value fails to be distinguished from the noise, and the value is considered to be a value having a low reliability. In contrast, if the value of $C_4$ obtained in inverse analysis is greater than the level of the noise, the value has not received an influence of the noise, and the value is considered to be a value having a high reliability.

Controller 51 calculates principal stress sum $\sigma_m$, and also determines whether the value of $C_4$ is greater than or equal to a predetermined value (for example, $1 \times 10^{-4}$) (step S18). The predetermined value is set to be greater than or equal to a noise level of infrared camera 30. In a case where the value of $C_4$ is greater than or equal to the predetermined value (YES in step S18), controller 51 determines that obtained values of $C_1$ to $C_4$ have not received an influence of noise (step S19). In contrast, in a case where the value of variable $C_4$ is less than the predetermined value (NO in step S18), controller 51 determines that the obtained values (identified values) of $C_1$ to $C_4$ have received an influence of noise (step S21). This determination result may be displayed on display 53 of information processing device 50, or may be stored as a flag indicating the determination result in data storage 57 in association with the obtained values.

As described above, principal stress sum $\sigma_m$ of the substrate material of test piece 1 can be obtained on the basis of data of an infrared image of test piece 1.

<1-2-2. Calculation of Thermophysical Property Value or Film Thickness of Coating Film>

Figure 11:
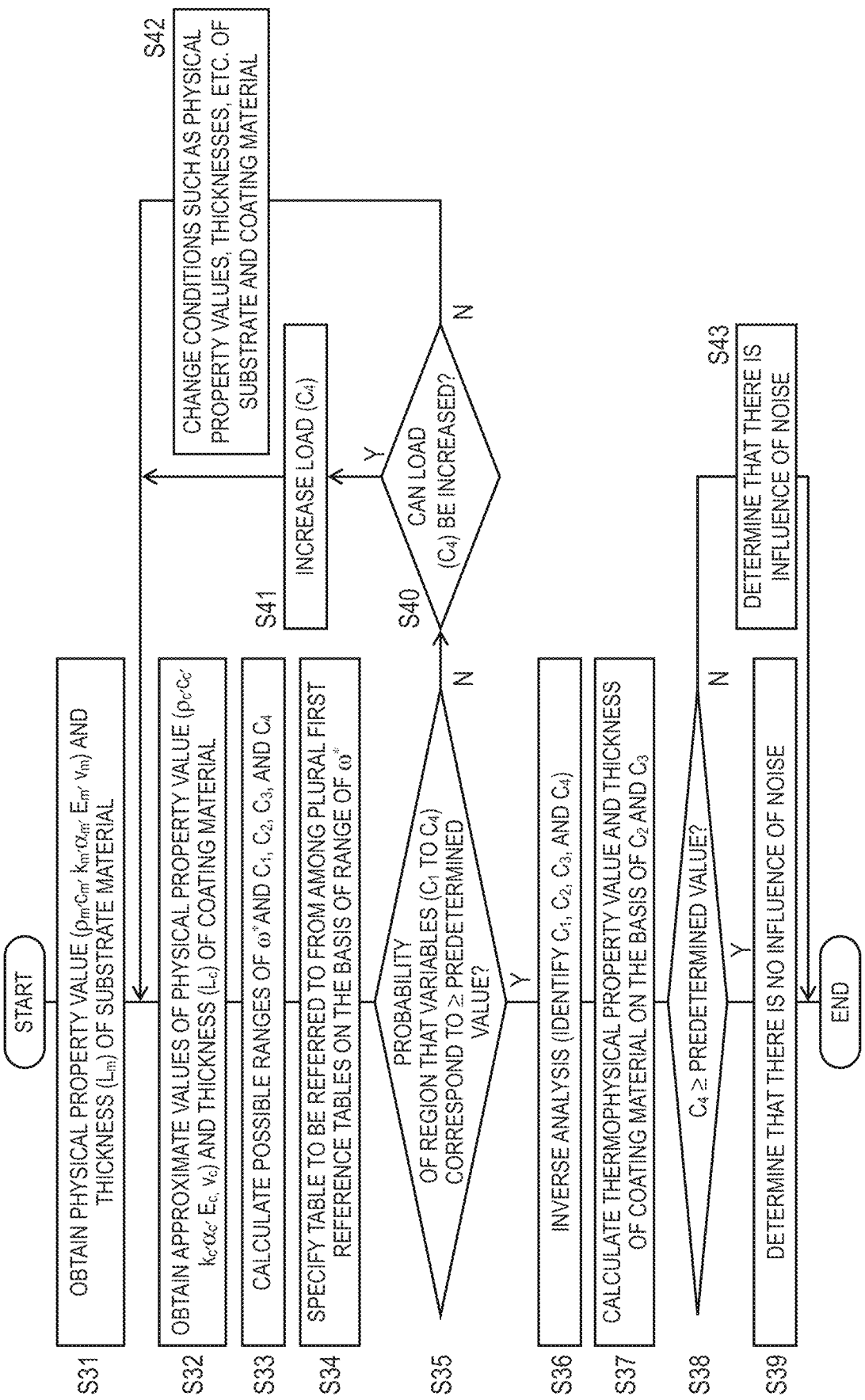
FIG. 11 is a flowchart illustrating processing for calculating heat characteristics of a coating material in an information processing device.

FIG. 11 is a flowchart illustrating processing for calculating a thermophysical property value or a film thickness of a coating film in information processing device 50. The processing for calculating the thermophysical property value or the film thickness of the coating film is described below with reference to this flowchart. This processing is performed by controller 51 of information processing device 50.

Controller 51 first obtains physical property value ($\rho_m$, $c_m$, $k_m$, $\alpha_m$, $E_m$, $v_m$) and thickness ($L_m$) of a substrate material (step S31).

Next, controller 51 obtains approximate values of physical property value ($\rho_c$, $c_c$, $k_c$, $\alpha_c$, $E_c$, $v_c$) and thickness ($L_c$) of the coating material (step S32). In general, it is difficult to obtain an exact value of the physical property value of the coating material, and therefore it is sufficient if an approximate value (to the extent that an order can be recognized) is used.

Controller 51 calculates possible ranges of angular frequency $\omega^*$ and variables $C_1$ to $C_4$ (step S33).

Next, controller 51 selects one table of a plurality of first reference tables (see FIG. 6) on the basis of a range of angular frequency $\omega^*$ (step S34).

Controller 51 determines whether a probability for a region that corresponds to respective variables $C_1$ to $C_4$ in the selected first reference table is greater than or equal to a predetermined value (for example, 70%) (step S35).

In a case where a probability for a corresponding region is less than the predetermined value (NO in step S35), controller 51 further determines whether a load can be increased (namely, whether $C_4$) can be increased (step S40). In a case where the load ($C_4$) can be increased (YES in step S40), controller 51 increases $C_4$ (step S41), and the processing returns to step S32. In contrast, in a case where the load ($C_4$) fails to be increased (NO in step S40), controller 51 newly sets the physical property values and the thicknesses of the substrate and the coating material (step S42). Stated another way, a value of $C_2$ is adjusted, and the processing returns to step S32. By doing this, the ranges of the respective variables are reset, and a first reference table is selected again.

In contrast, in a case where the probability for the corresponding region is greater than or equal to the predetermined value (YES in step S35), controller 51 performs inverse analysis by using formula (7) while changing values of respective variables $C_1$ to $C_4$ within ranges specified in the selected first reference table, and identifies variables $C_1$ to $C_4$ (step S36).

When identified values of variables $C_1$ to $C_4$ are obtained, controller 51 calculates a thermophysical property value or a film thickness of the coating material on the basis of $C_2$ and $C_3$ (step S37). Stated another way, if either one of the thermophysical property value and the film thickness of the coating material is known, an unknown value of the thermophysical property value and the film thickness can be obtained by using $C_2$, $C_3$, and a known value of the thermophysical property value and the film thickness.

Then, controller 51 determines whether a value of $C_4$ is greater than or equal to a predetermined value (for example, $1\times10^{-4}$) (step S38). The predetermined value is set to be greater than or equal to a noise level of infrared camera 30. In a case where the value of $C_4$ is greater than or equal to the predetermined value (YES in step S38), controller 51 determines that obtained values of $C_1$ to $C_4$ have not received an influence of noise (step S39). In contrast, in a case where the value of $C_4$ is less than the predetermined value (NO in step S38), controller 51 determines that the obtained values (identified values) of $C_1$ to $C_4$ have received the influence of noise (step S43).

As described above, by employing stress measurement system 100 according to the present exemplary embodiment, a physical property value of a coating material of an object to be measured (test piece 1) can be measured in addition to a principal stress sum.

1-3. Demonstration Results

Results of verification performed by stress measurement system 100 described in the present exemplary embodiment are described below. Test piece 1 that had been coated was attached to a hydraulic servo fatigue testing machine, and a sine wave shape repeated load of uniaxial tension was applied. A change in temperature due to a thermoelastic effect generated on a surface of test piece 1 to which the load had been applied was photographed by using infrared camera 30 (infrared thermography). In information processing device 50, frequency analysis was performed on data of a captured temperature image so as to obtain an amplitude characteristic and a phase characteristic of a surface temperature.

As vibration generator 10, the hydraulic servo fatigue testing machine "L10 kN" from Shimadzu Corporation was used. In addition, as control device 15 of vibration generator 10, the 4830 type from Shimadzu Corporation was used. As infrared camera 30, the infrared thermography "Silver 480M" from Cedip Infrared Systems was used.

In an experiment, test pieces obtained by coating two types of substrate materials, ABS and SUS304, with black paint, and a test piece obtained by coating an aluminum substrate material with a polyimide tape were used. With respect to an ABS substrate, three types of test pieces for which coating films have thicknesses different from each other were prepared. With respect to a SUS304 substrate, five types of test pieces for which coating films have thicknesses different from each other were prepared. With respect to the aluminum (A5052) substrate material, two types of test pieces (A5052-1, A5052-2) for which coating films have thicknesses (55 μm, 110 μm) different from each other were prepared.

Load conditions are described below. All of the stress ratios are 0. A load amplitude (both amplitudes) is 0.1 kN for the ABS substrate, 3.0 kN for the SUS304 substrate, and 3.0 kN for the A5052 substrate. Vibration frequency f is 1, 3, 5, 10, 15, 20, 25, or 30 Hz. An experiment was also conducted at 35 or 40 Hz only for A5052-2.

Photographing conditions of infrared camera 30 are described below. A frame rate was assumed to be 249 Hz, and 2000-frame photographing was performed at each of the vibration frequencies. Fourier transform is performed on data of a change in temperature and a phase that has been obtained by infrared camera 30 in pixel units at the vibration frequency in information processing device 50, so that the data is converted into a temperature amplitude and a temperature phase (a phase delay) at each of the frequencies.

In information processing device 50, inverse analysis is performed using measurement data, and $C_1$ to $C_4$ are identified. A fitting curve obtained by performing inverse analysis on measurement data of each of the test pieces is illustrated in FIGS. 12A to 14B. In FIGS. 12A to 14B, all of the horizontal axes are indicated by a logarithmic expression of $\omega^*$, and temperature amplitudes are made dimensionless by using initial temperature $T_0$=300 K and are indicated.

Figure 12A:
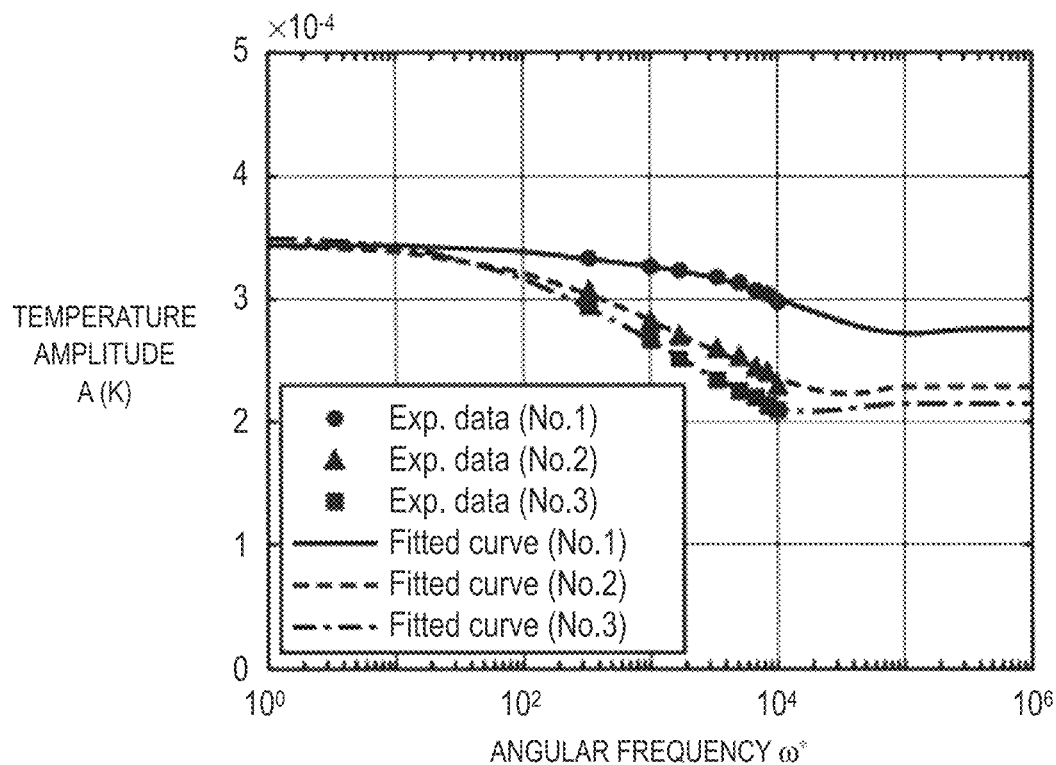
FIG. 12A is a diagram illustrating fitting results of a temperature amplitude with respect to three test pieces of an ABS substrate.
Figure 12B:
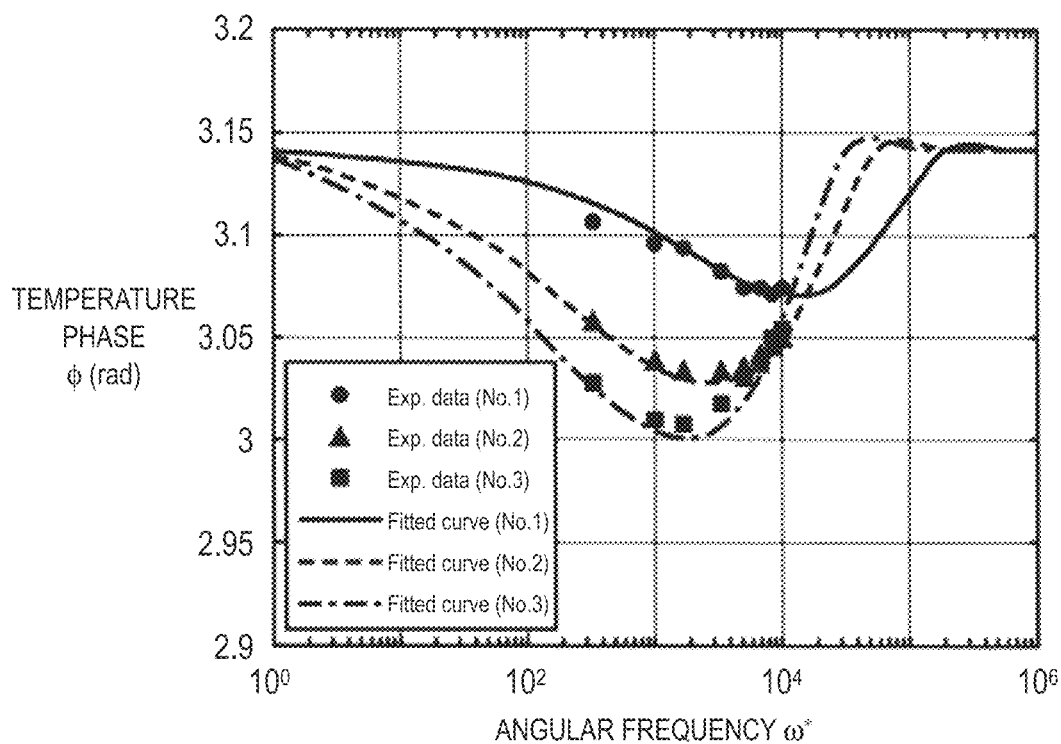
FIG. 12B is a diagram illustrating fitting results of a temperature phase with respect to three test pieces of an ABS substrate.

FIGS. 12A and 12B respectively illustrate temperature amplitude A [K] and temperature phase (phase delay) $\varphi$ [rad] with respect to a test piece of the ABS substrate.

Figure 13A:
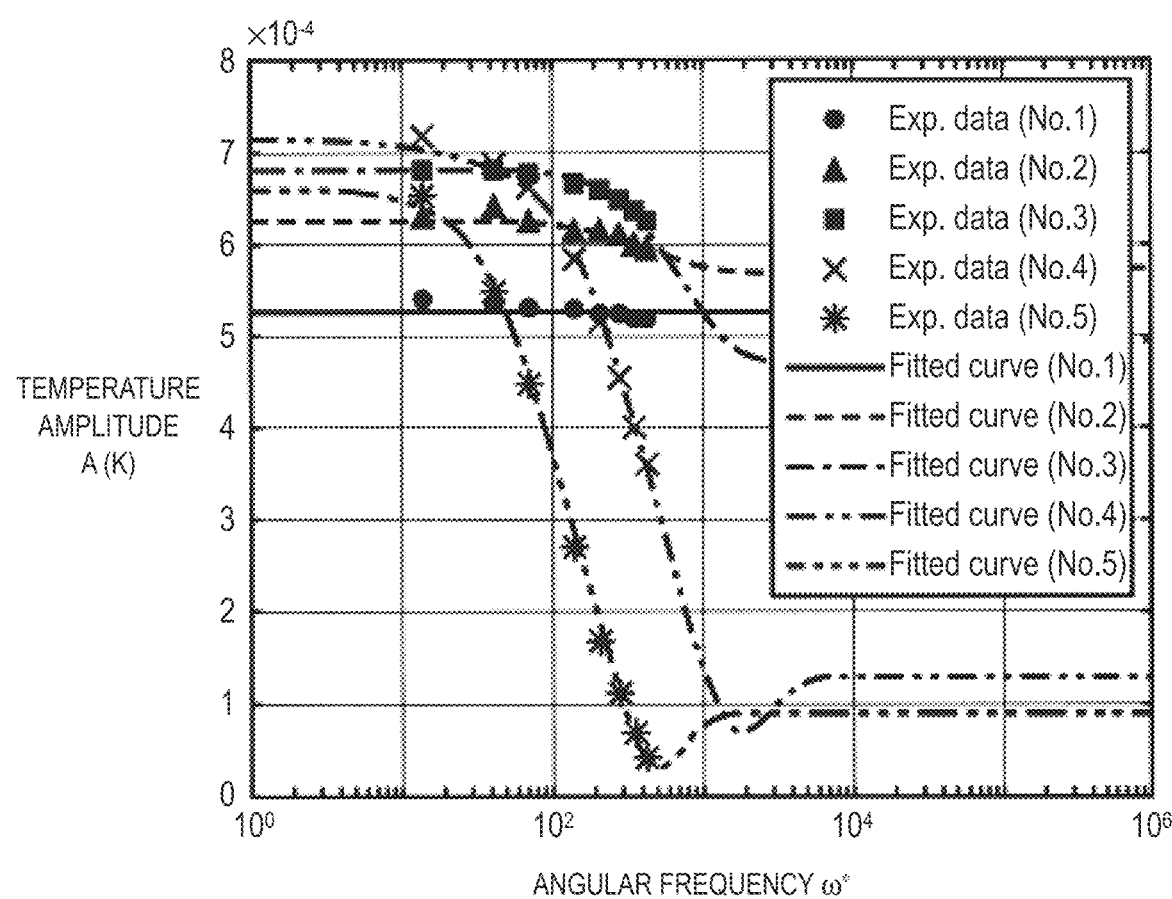
FIG. 13A is a diagram illustrating fitting results of a temperature amplitude with respect to five test pieces of a stainless substrate.

FIGS. 13A and 13B respectively illustrate temperature amplitude A [K] and temperature phase (phase delay) $\varphi$ [rad] with respect to a test piece of the SUS304 substrate.

Figure 14A:
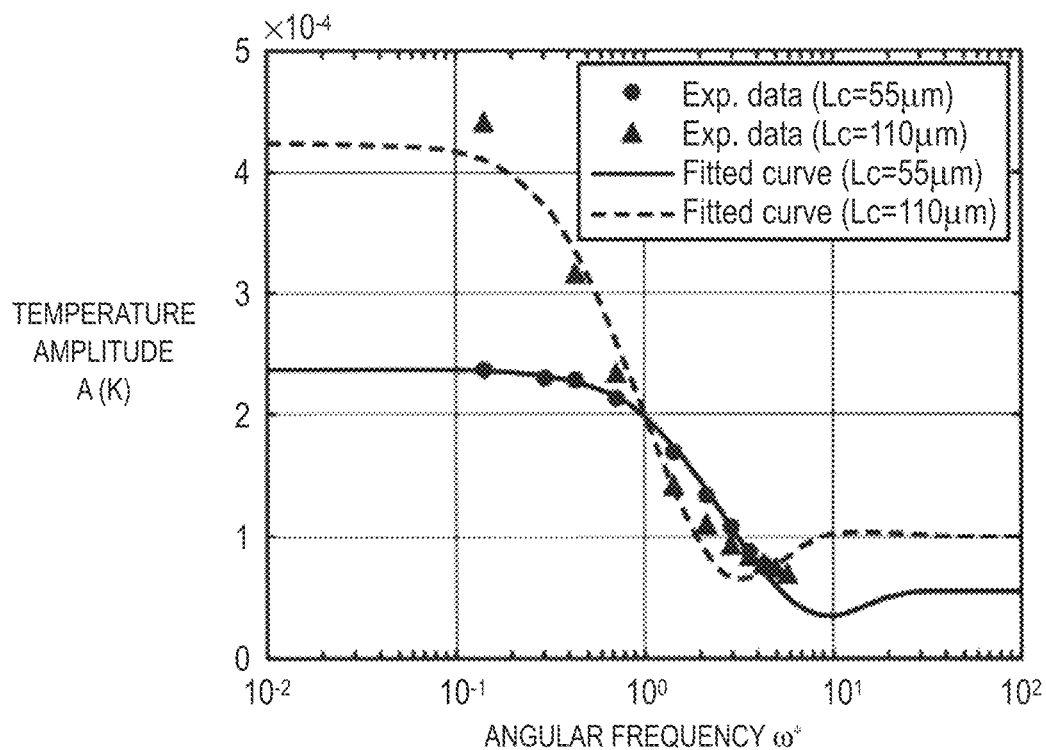
FIG. 14A is a diagram illustrating fitting results of a temperature amplitude with respect to two test pieces of an aluminum substrate.
Figure 14B:
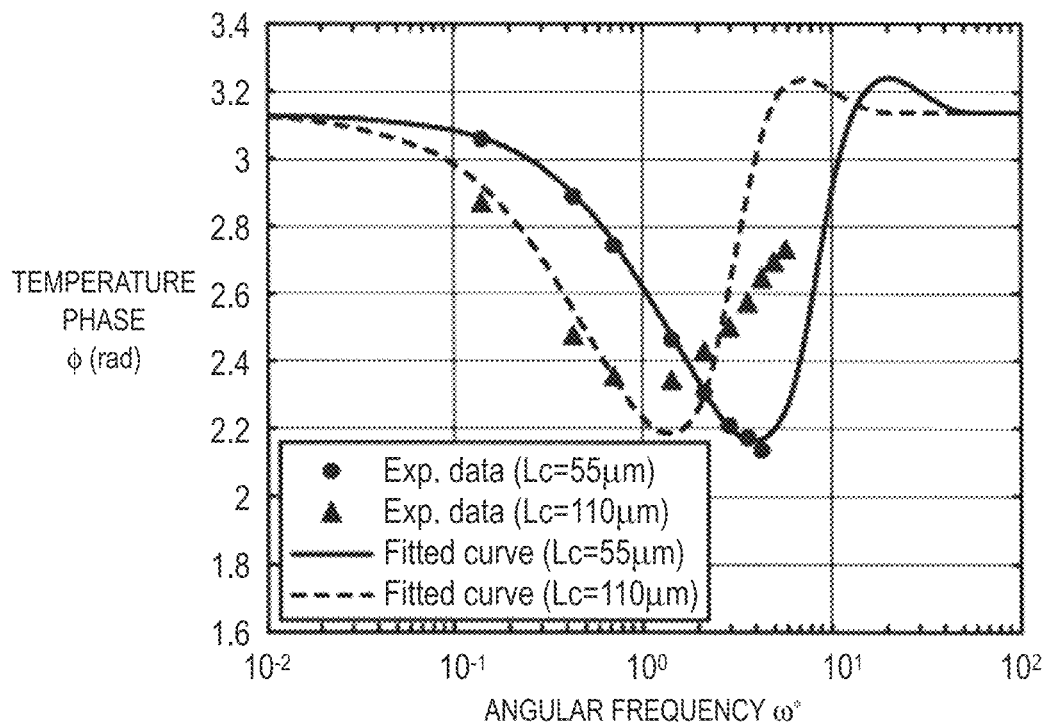
FIG. 14B is a diagram illustrating fitting results of a temperature phase with respect to two test pieces of an aluminum substrate.

FIGS. 14A and 14B respectively illustrate temperature amplitude A [K] and temperature phase (phase delay) $\varphi$ [rad] with respect to a test piece of the A5052 substrate.

As illustrated in FIGS. 12A to 13B, it can be understood that, with respect to all of the test pieces of the ABS substrate and the SUS304 substrate, fitting curves indicating the temperature amplitude and the temperature phase (the phase delay) are sufficiently fitted to measurement data.

On the other hand, as illustrated in FIGS. 14A and 14B, from among analysis results of the A5052 substrates, an analysis result for A5052-1 (thickness Lc=55 μm) is sufficiently fitted to measurement data. With respect to A5052-2 (thickness Lc=110 μm), a result that is fitted to measurement data to a certain degree has been obtained, although the result is not fitted as sufficiently as a result for A5052-1 (thickness Lc=55 μm).

Four parameters identified as described above, and a principal stress sum (a stress amplitude) and a film thickness of a coating material that have been calculated from the four parameters are illustrated in FIG. 15.

1-4. Advantageous Effects and the Like

As described above, a stress measurement method according to the present exemplary embodiment is a method for measuring a stress of an object to be measured that includes a substrate and a coating film. In the stress measurement method, test piece 1 (the object to be measured) is vibrated at a plurality of oscillation frequencies. A temperature amplitude of test piece 1 is measured by using infrared camera 30 (a temperature sensor). Parameters of a one-dimensional heat conduction equation ((see formulae (1) and (2a) to (2d))) are identified by performing curve-fitting, on the basis of the one-dimensional heat conduction equation, on a measurement value of the temperature amplitude with respect to frequency characteristics of a temperature change component and a phase component based on a thermoelastic effect. The frequency characteristics are obtained at the plurality of oscillation frequencies. The one-dimensional heat conduction equation indicates a theoretical solution of a temperature amplitude on a surface of the coating film based on heat conduction and the thermoelastic effect of both the substrate and the coating film. Then, a stress of test piece 1 is obtained on the basis of the identified parameters.

By employing the formulae described above that have been specified by four variables $C_1$ to $C_4$ as a one-dimensional heat conduction equation, a probability of obtaining identified values in inverse analysis increases, and a theoretical solution to the heat conduction equation can be obtained more securely.

In the stress measurement method according to the present exemplary embodiment, the curve-fitting includes fitting according to a least-squares method. A trust region method or a trust region reflective method is used as the least-squares method.

In the stress measurement method according to the present exemplary embodiment, a reference table (an example of table information) is stored for a plurality of combinations of the substrate and the coating film. The reference table indicates possible ranges of the parameters of the one-dimensional heat conduction equation at oscillation frequencies different from each other. In the stress measurement method according to the present exemplary embodiment, the reference table is referred to, the possible ranges of the parameters of the one-dimensional heat conduction equation are set, and curve fitting is performed while the parameters are changed within the set ranges.

By determining ranges of variables by using the reference table described above, identified values of variables $C_1$ to $C_4$ can be obtained precisely and securely.

The stress measurement method according to the present exemplary embodiment further includes obtaining a thermophysical property or a film thickness of the coating film on the basis of the identified parameters.

The present exemplary embodiment also discloses a stress measurement device of an object to be measured that includes a substrate and a coating film. The stress measurement device according to the present exemplary embodiment is a stress measurement device that obtains a value of a stress of an object to be measured including a substrate and a coating film on the basis of a temperature amplitude image of the object to be measured that has been vibrated. The stress measurement device includes device interface 58 (an example of an obtaining unit) that obtains a temperature amplitude, and controller 51 (an example of a controller) that calculates a stress of test piece 1 (an example of the object to be measured) on the basis of the temperature amplitude image. Controller 51 obtains, from the temperature amplitude, a measurement value of a temperature amplitude on a surface of the coating film based on heat conduction and a thermoelastic effect of both the substrate and the coating film, and identifies parameters of a one-dimensional heat conduction equation ((see formulae (1) and (2a) to (2d))) by performing curve-fitting, on the basis of the one-dimensional heat conduction equation, on the measurement value of the temperature amplitude with respect to frequency characteristics of a temperature change component and a phase component based on the thermoelastic effect. The frequency characteristics are obtained at a plurality of oscillation frequencies different from each other. The one-dimensional heat conduction equation indicates a theoretical solution of the surface of the coating film. Controller 51 obtains the stress of the object to be measured on the basis of the identified parameters.

The present exemplary embodiment also discloses a stress measurement system of an object to be measured that includes a substrate and a coating film. Stress measurement system 100 according to the present exemplary embodiment is a system that vibrates an object to be measured that includes a substrate and a coating film, measures a temperature amplitude of the object to be measured, and obtains a value of a stress of the object to be measured from a measurement result. Stress measurement system 100 includes vibration generator 10 that repeatedly applies a load to test piece 1 (an example of the object to be measured) at a predetermined frequency, infrared camera 30 (an example of a temperature sensor) that measures a temperature amplitude of test piece 1 that the load has been applied to, and information processing device 50 (an example of a stress measurement device) that obtains the stress of the object to be measured on the basis of a temperature image that has been obtained from infrared camera 30. Controller 51 identifies parameters of a one-dimensional heat conduction equation ((see formulae (1) and (2a) to (2d))) by performing curve-fitting, on the basis of the one-dimensional heat conduction equation, on a measurement value of the temperature amplitude with respect to frequency characteristics of a temperature change component and a phase component based on a thermoelastic effect. The frequency characteristics are obtained at a plurality of oscillation frequencies. The one-dimensional heat conduction equation indicates a theoretical solution of a temperature amplitude on a surface of the coating film based on heat conduction and the thermoelastic effect of both the substrate and the coating film. Controller 51 obtains the stress of the object to be measured on the basis of the identified parameters.

Other Exemplary Embodiments

As described above, the first exemplary embodiment has been described as an example of the technique disclosed in the present application. However, the technique of the present disclosure is not limited to the first exemplary embodiment, and is also applicable to exemplary embodiments that have undergone modifications, replacements, additions, omissions, or the like, as appropriate. In addition, new exemplary embodiments can also be achieved by combining the respective components described in the first exemplary embodiment above.

The substrate and the coating material of the object to be measured (the test piece) that have been described above are examples, and an idea of the present disclosure is applicable to objects to be measured that respectively include a variety of substrates and coating materials.

As described above, the exemplary embodiments have been described as examples of the technique of the present disclosure. For this purpose, the accompanying drawings and the detailed description have been provided.

In the exemplary embodiments described above, a control program executed by controller 51 may be provided to information processing device 50 via network 200, or may be installed from a recording medium such as a compact disc read-only memory (CD-ROM). In addition, controller 51 may be a dedicated circuit that has been designed so as to realize a function of controller 51 by only using a hardware circuit. Controller 51 may include a CPU or an MPU, or may include a digital signal processor (DSP), a field-programmable gate array (FPGA), an application specific integrated circuit (ASIC), or the like.

In the exemplary embodiments described above, an infrared camera that is capable of obtaining a temperature image has been used as a temperature sensor. However, a temperature sensor according to the present disclosure is not limited to the infrared camera. For example, a contact type or non-contact type temperature sensor may be used, and a stress of an object to be measured may be measured on the basis of a temperature amplitude at a specified point.

Accordingly, in order to exemplify the technique described above, the components described in the accompanying drawings and the detailed description may not only include components that are essential for solving the problems, but may also include components that are not essential for solving the problems. For this reason, it should not be immediately deemed that those components that are not essential are essential just because those components that are not essential are described in the accompanying drawings and the detailed description.

Moreover, since the exemplary embodiments described above have been provided to exemplify the technique of the present disclosure, various modifications, replacements, additions, omissions, or the like can be made within the scope of the claims or their equivalents.

INDUSTRIAL APPLICABILITY

The present disclosure can be applied to a measurement device that measures a stress of an object to be measured that includes a substrate and a coating film on the basis of an infrared image.

REFERENCE MARKS IN THE DRAWINGS

1 test piece (object to be measured)
10 vibration generator
30 infrared camera (temperature sensor)
40 function generator
50 information processing device (stress measurement device)
51 controller (arithmetic unit)
57 data storage
57b reference table (table information)
100 stress measurement system

The invention claimed is:

1. A stress measurement method for an object to be measured that includes a substrate and a coating film, the stress measurement method comprising:
   vibrating the object to be measured at a plurality of oscillation frequencies;
   measuring a temperature amplitude of the object to be measured by using a temperature sensor;
   identifying parameters of a one-dimensional heat conduction equation described below by performing curve-fitting, based on the one-dimensional heat conduction equation, on a measurement value of the temperature amplitude with respect to frequency characteristics of a temperature change component and a phase component based on a thermoelastic effect, the frequency characteristics being obtained at the plurality of oscillation frequencies, the one-dimensional heat conduction equation indicating a theoretical solution of a temperature amplitude on a surface of the coating film based on heat conduction and the thermoelastic effect of each of the substrate and the coating film, $$T^*_{theory} = \frac{\hat{T}_{theory}}{T_0} = -C_4 \left[ \frac{1 - C_1}{\frac{C_3}{\tanh\left((1+i)\sqrt{\frac{\omega^*}{2}}\right)} + \frac{1}{\tanh\left((1+i)\sqrt{\frac{\omega^*}{2}}C_2\right)}} + C_1 \right]$$

$$C_1 = \frac{c_1 c_4}{c_3} = \frac{\frac{E_c}{1-v_c}}{\frac{E_m}{1-v_m}} \cdot \frac{\alpha_c}{\alpha_m} \cdot \frac{\rho_m c_m}{\rho_c c_c} = \frac{\frac{E_c}{1-v_c}}{\frac{E_m}{1-v_m}} \cdot \frac{K_c}{K_m}$$

$$C_2 = \frac{c_3 c_5^2}{c_2} = \frac{\left(\frac{L_c}{L_m}\right)^2}{\frac{k_c}{k_m} \cdot \frac{\rho_m c_m}{\rho_c c_c}} = \frac{\left(\frac{L_c}{L_m}\right)^2}{\frac{\alpha_c}{\alpha_m}}$$

$$C_3 = \sqrt{c_2 c_3} = \frac{\sqrt{\rho_c c_c k_c}}{\sqrt{\rho_m c_m k_m}} = \frac{b_c}{b_m}$$

$$C_4 = \frac{c_6}{T_0} = \varepsilon K_m \sigma_m$$

where $T_0$ is reference temperature, $T^*_{theory}$ is Fourier transform of temperature, E is a modulus of longitudinal elasticity, K is a thermoelastic constant, v is a Poisson's ratio, c is specific heat at constant pressure, k is heat conductivity, $\rho$ is density, $\alpha$ is a linear expansion coefficient, L is film thickness, and a subscript m and a subscript c respectively indicate the substrate and the coating film; and
   obtaining a stress of the object to be measured based on the parameters that have been identified.

2. The stress measurement method according to claim 1, wherein the curve-fitting includes fitting according to a least-squares method.

3. The stress measurement method according to claim 2, wherein a trust region method or a trust region reflective method is used as the least-squares method.

4. The stress measurement method according to claim 1, further comprising:
   storing table information for a plurality of combinations of the substrate and the coating film, the table information indicating possible ranges of the parameters of the one-dimensional heat conduction equation at the plurality of oscillation frequencies; and
   referring to the table information, and setting the possible ranges of the parameters of the one-dimensional heat conduction equation,
   wherein the curve-fitting is performed while the parameters are changed within the possible ranges that have been set.

5. The stress measurement method according to claim 1, further comprising obtaining a thermophysical property or the film thickness of the coating film based on the parameters that have been identified.

6. A stress measurement device that obtains a value of a stress of an object to be measured including a substrate and a coating film based on a temperature amplitude of the object to be measured, the object to be measured having been vibrated, the stress measurement device comprising:
   an obtaining unit that obtains the temperature amplitude; and
   a controller that calculates the stress of the object to be measured based on the temperature amplitude,
   wherein the controller performs:
   obtaining, from the temperature amplitude, a measurement value of a temperature amplitude on a surface of the coating film based on heat conduction and a thermoelastic effect of each of the substrate and the coating film;
   identifying parameters of a one-dimensional heat conduction equation described below by performing curve-fitting, based on the one-dimensional heat conduction equation, on the measurement value of the temperature amplitude with respect to frequency characteristics of a temperature change component and a phase component based on the thermoelastic effect, the frequency characteristics being obtained at a plurality of oscillation frequencies, the one-dimensional heat conduction equation indicating a theoretical solution of the surface of the coating film, $$T^*_{theory} = \frac{T^{\hat{}}_{theory}}{T_0} = -C_4 \left[ \frac{1-C_1}{\frac{\sinh\left((1+i)\sqrt{\frac{\omega^*}{2}C_2}\right)}{\frac{C_3}{\tanh\left((1+i)\sqrt{\frac{\omega^*}{2}}\right)} + \frac{1}{\tanh\left((1+i)\sqrt{\frac{\omega^*}{2}C_2}\right)}} + C_1 \right]$$

$$C_1 = \frac{c_1 c_4}{c_3} = \frac{\frac{E_c}{1-v_c}}{\frac{E_m}{1-v_m}} \cdot \frac{\alpha_c}{\alpha_m} \cdot \frac{\rho_m c_m}{\rho_c c_c} = \frac{\frac{E_c}{1-v_c}}{\frac{E_m}{1-v_m}}, \frac{K_c}{K_m}$$

$$C_2 = \frac{c_3 c_5^2}{c_2} = \frac{\left(\frac{L_c}{L_m}\right)^2}{\frac{k_c}{k_m} \cdot \frac{\rho_m c_m}{\rho_c c_c}} = \frac{\left(\frac{L_c}{L_m}\right)^2}{\frac{\alpha_c}{\alpha_m}}$$

$$C_3 = \sqrt{c_2 c_3} = \frac{\sqrt{\rho_c c_c k_c}}{\sqrt{\rho_m c_m k_m}} = \frac{b_c}{b_m}$$

$$C_4 = \frac{c_6}{T_0} = \varepsilon K_m \sigma_m$$

where $T_0$ is reference temperature, $T^{\hat{}}_{theory}$ is Fourier transform of temperature, E is a modulus of longitudinal elasticity, K is a thermoelastic constant, v is a Poisson's ratio, c is specific heat at constant pressure, k is heat conductivity, ρ is density, α is a linear expansion coefficient, L is film thickness, and a subscript m and a subscript c respectively indicate the substrate and the coating film; and
   obtaining the stress of the object to be measured based on the parameters that have been identified.

7. The stress measurement device according to claim 6, wherein the curve-fitting includes fitting according to a least-squares method.

8. The stress measurement device according to claim 7, wherein a trust region method or a trust region reflective method is used as the least-squares method.

9. The stress measurement device according to claim 6, further comprising a data storage that stores table information for a plurality of combinations of the substrate and the coating film, the table information indicating possible ranges of the parameters of the one-dimensional heat conduction equation at the plurality of oscillation frequencies,
   wherein
   the controller refers to the table information that has been stored in the data storage, and sets the possible ranges of the parameters of the one-dimensional heat conduction equation, and
   the curve-fitting is performed while the parameters are changed within the possible ranges that have been set.

10. The stress measurement device according to claim 6, wherein
   the controller further obtains a thermophysical property or the film thickness of the coating film based on the parameters that have been identified.

11. A stress measurement system that vibrates an object to be measured that includes a substrate and a coating film, measures a temperature amplitude of the object to be measured, and obtains a value of a stress of the object to be measured from a measurement result, the stress measurement system comprising:
   a vibration generator that repeatedly applies a load to the object to be measured at a predetermined frequency;
   a temperature sensor that measures the temperature amplitude of the object to be measured that the load has been applied to; and
   an information processing device that obtains the stress of the object to be measured based on the temperature amplitude that has been obtained from the temperature sensor,
   wherein the information processing device performs:
   identifying parameters of a one-dimensional heat conduction equation described below by performing curve-fitting, based on the one-dimensional heat conduction equation, on a measurement value of the temperature amplitude with respect to frequency characteristics of a temperature change component and a phase component based on a thermoelastic effect, the frequency characteristics being obtained at the plurality of oscillation frequencies, the one-dimensional heat conduction equation indicating a theoretical solution of a temperature amplitude on a surface of the coating film based on heat conduction and the thermoelastic effect of each of the substrate and the coating film, $$T^*_{theory} = \frac{T\hat{}_{theory}}{T_0} = -C_4\left[\frac{\frac{1-C_1}{\sinh\left((1+i)\sqrt{\frac{\omega^*}{2}}C_2\right)}}{\frac{C_3}{\tanh\left((1+i)\sqrt{\frac{\omega^*}{2}}\right)} + \frac{1}{\tanh\left((1+i)\sqrt{\frac{\omega^*}{2}}C_2\right)}} + C_1\right]$$

$$C_1 = \frac{c_1 c_4}{c_3} = \frac{\frac{E_c}{1-v_c}}{\frac{E_m}{1-v_m}} \cdot \frac{\alpha_c}{\alpha_m} \cdot \frac{\rho_m c_m}{\rho_c c_c} = \frac{\frac{E_c}{1-v_c}}{\frac{E_m}{1-v_m}}, \frac{K_c}{K_m}$$

$$C_2 = \frac{c_3 c_5^2}{c_2} = \frac{\left(\frac{L_c}{L_m}\right)^2}{\frac{k_c}{k_m} \cdot \frac{\rho_m c_m}{\rho_c c_c}} = \frac{\left(\frac{L_c}{L_m}\right)^2}{\frac{\alpha_c}{\alpha_m}}$$

$$C_3 = \sqrt{c_2 c_3} = \frac{\sqrt{\rho_c c_c k_c}}{\sqrt{\rho_m c_m k_m}} = \frac{b_c}{b_m}$$

$$C_4 = \frac{c_6}{T_0} = \varepsilon K_m \sigma_m$$

where $T_0$ is reference temperature, $T\hat{}_{theory}$ is Fourier transform of temperature, E is a modulus of longitudinal elasticity, K is a thermoelastic constant, v is a Poisson's ratio, c is specific heat at constant pressure, k is heat conductivity, ρ is density, α is a linear expansion coefficient, L is film thickness, and a subscript m and a subscript c respectively indicate the substrate and the coating film; and obtaining the stress of the object to be measured based on the parameters that have been identified.

\* \* \* \* \*